United States Patent
Onuki et al.

(10) Patent No.: US 12,051,924 B2
(45) Date of Patent: Jul. 30, 2024

(54) SEMICONDUCTOR DEVICE AND CHARGE CONTROL SYSTEM

(71) Applicant: Semiconductor Energy Laboratory Co., Ltd., Atsugi (JP)

(72) Inventors: Tatsuya Onuki, Atsugi (JP); Takayuki Ikeda, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 370 days.

(21) Appl. No.: 17/291,005

(22) PCT Filed: Nov. 12, 2019

(86) PCT No.: PCT/IB2019/059682
§ 371 (c)(1),
(2) Date: May 4, 2021

(87) PCT Pub. No.: WO2020/104892
PCT Pub. Date: May 28, 2020

(65) Prior Publication Data
US 2022/0045532 A1   Feb. 10, 2022

(30) Foreign Application Priority Data
Nov. 22, 2018 (JP) .................. 2018-219323

(51) Int. Cl.
*H02J 7/00* (2006.01)
*H01M 10/44* (2006.01)
(Continued)

(52) U.S. Cl.
CPC ......... *H02J 7/00302* (2020.01); *H01M 10/44* (2013.01); *H01M 10/48* (2013.01);
(Continued)

(58) Field of Classification Search
CPC .................................................. H02J 7/00302
(Continued)

(56) References Cited

U.S. PATENT DOCUMENTS 6,835,491 B2   12/2004   Gartstein et al.
7,456,606 B1   11/2008   Legg
(Continued)

FOREIGN PATENT DOCUMENTS

CN   105229852 A   1/2016
EP   3000152       3/2016
(Continued)

OTHER PUBLICATIONS

International Search Report (Application No. PCT/IB2019/059682) dated Feb. 18, 2020.
(Continued)

*Primary Examiner* — Edward Tso
*Assistant Examiner* — Ahmed H Omar
(74) *Attorney, Agent, or Firm* — Eric J. Robinson; Robinson Intellectual Property Law Office, P.C.

(57) ABSTRACT

A structure that includes a circuit for controlling the safe operation of a secondary battery but can overcome space limitations owing to miniaturization of the housing is provided. A charge control circuit is provided over a flexible substrate and bonded to an external surface of the secondary battery. The charge control circuit is electrically connected to at least one of two terminals of the secondary battery and controls charging. To prevent overcharge, both an output transistor of a charging circuit and a blocking switch are brought into off state substantially concurrently. Blocking two paths which connect to the battery can quickly stop charging when overcharge is detected and reduce damage to the battery owing to the overcharge.

12 Claims, 18 Drawing Sheets

(51) Int. Cl.
*H01M 10/48* (2006.01)
*H02J 50/10* (2016.01)
*H01L 23/522* (2006.01)
*H01L 29/78* (2006.01)
*H01L 29/786* (2006.01)

(52) U.S. Cl.
CPC ............ *H02J 7/0042* (2013.01); *H02J 50/10* (2016.02); *H01L 23/5223* (2013.01); *H01L 29/7851* (2013.01); *H01L 29/7869* (2013.01)

(58) Field of Classification Search
USPC ........................................................ 320/132
See application file for complete search history.

(56) References Cited

U.S. PATENT DOCUMENTS

| | | | |
|---|---|---|---|
| 7,511,454 | B1 | 3/2009 | Legg |
| 9,478,850 | B2 | 10/2016 | Bourilkov et al. |
| 9,577,446 | B2 | 2/2017 | Yamazaki et al. |
| 9,887,463 | B2 | 2/2018 | Bourilkov et al. |
| 10,742,056 | B2 | 8/2020 | Yamazaki et al. |
| 10,916,850 | B2 | 2/2021 | Bourilkov et al. |
| 2002/0001745 | A1* | 1/2002 | Gartstein ............ H01M 10/425 320/132 |
| 2011/0187329 | A1 | 8/2011 | Majima et al. |
| 2013/0162203 | A1 | 6/2013 | Kamata |
| 2013/0241286 | A1 | 9/2013 | Yamazaki |
| 2013/0257354 | A1 | 10/2013 | Koyama |
| 2013/0265010 | A1 | 10/2013 | Nomura et al. |
| 2013/0290747 | A1 | 10/2013 | Miwa et al. |
| 2014/0021904 | A1 | 1/2014 | Takahashi et al. |
| 2014/0121787 | A1 | 5/2014 | Yamazaki et al. |
| 2014/0173300 | A1* | 6/2014 | Yamazaki ............ H02J 7/00036 713/300 |
| 2014/0184165 | A1 | 7/2014 | Takahashi et al. |
| 2014/0347249 | A1 | 11/2014 | Bourilkov et al. |
| 2016/0043070 | A1 | 2/2016 | Momo et al. |
| 2016/0043715 | A1 | 2/2016 | Kurokawa et al. |
| 2016/0043716 | A1 | 2/2016 | Kurokawa et al. |
| 2016/0087305 | A1 | 3/2016 | Yoneda et al. |
| 2016/0094079 | A1 | 3/2016 | Hiroki et al. |
| 2016/0097501 | A1 | 4/2016 | Yoshitani et al. |
| 2016/0156012 | A1 | 6/2016 | Takahashi et al. |
| 2016/0204437 | A1 | 7/2016 | Tajima et al. |
| 2016/0211381 | A1 | 7/2016 | Kurokawa |
| 2016/0218387 | A1 | 7/2016 | Tajima |
| 2016/0240325 | A1 | 8/2016 | Tajima et al. |
| 2016/0254500 | A1 | 9/2016 | Kawata et al. |
| 2016/0315296 | A1 | 10/2016 | Kimura et al. |
| 2016/0343999 | A1 | 11/2016 | Yonemura et al. |
| 2016/0351975 | A1 | 12/2016 | Momo et al. |
| 2016/0372717 | A1 | 12/2016 | Noda |
| 2017/0005364 | A1 | 1/2017 | Yamazaki et al. |
| 2017/0117511 | A1 | 4/2017 | Takahashi et al. |
| 2017/0117589 | A1 | 4/2017 | Tajima et al. |
| 2017/0163047 | A1 | 6/2017 | Yamazaki et al. |
| 2017/0250383 | A1 | 8/2017 | Goto et al. |
| 2017/0373285 | A1 | 12/2017 | Tajima et al. |
| 2020/0220362 | A1 | 7/2020 | Yamazaki et al. |
| 2020/0278398 | A1 | 9/2020 | Isa et al. |
| 2020/0287414 | A1 | 9/2020 | Kusunoki et al. |
| 2020/0295413 | A1 | 9/2020 | Yamazaki et al. |

FOREIGN PATENT DOCUMENTS

| | | |
|---|---|---|
| JP | 09-312172 A | 12/1997 |
| JP | 2002-510850 | 4/2002 |
| JP | 2010-066161 A | 3/2010 |
| JP | 2014-135884 A | 7/2014 |
| JP | 2016-530742 | 9/2016 |
| JP | 2020-087540 A | 6/2020 |
| WO | WO-1999/052163 | 10/1999 |
| WO | WO-2014/189831 | 11/2014 |

OTHER PUBLICATIONS

Written Opinion (Application No. PCT/IB2019/059682) dated Feb. 18, 2020.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Hakozaki et al., "Development of Battery Management System for Lithium-ion Batteries", FB technical news, Nov. 1, 2014, No. 70, pp. 39-42.

Yamazaki.S et al., "In—Ga—Zn-Oxide Semiconductor and its Transistor Characteristics", ECS Journal of Solid State Science and Technology, Jul. 1, 2014, vol. 3, No. 9, pp. Q3012-Q3022.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

\* cited by examiner

At the time of charging

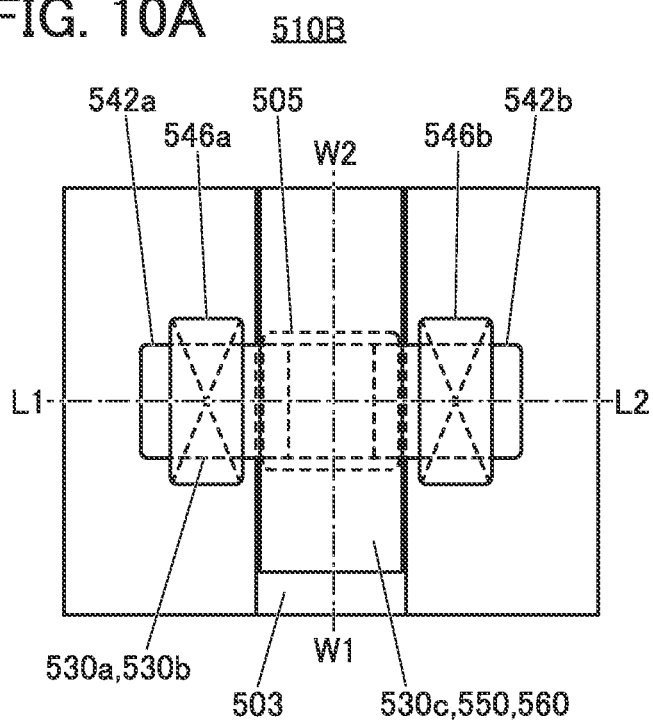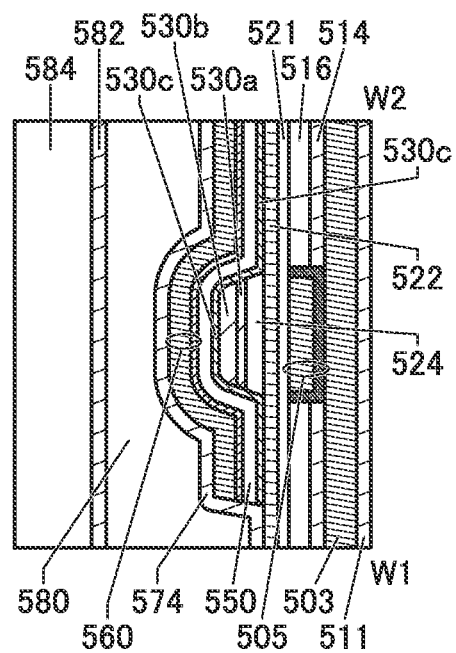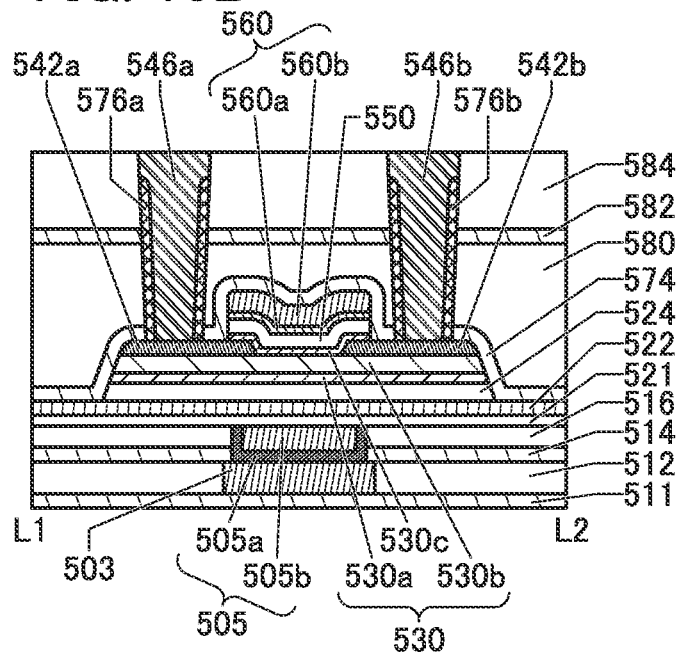

SEMICONDUCTOR DEVICE AND CHARGE CONTROL SYSTEM

TECHNICAL FIELD

One embodiment of the present invention relates to an object, a method, or a manufacturing method. Alternatively, the present invention relates to a process, a machine, manufacture, or a composition (composition of matter). One embodiment of the present invention relates to a semiconductor device, a display device, a light-emitting device, a power storage device, a lighting device, an electronic device, or a manufacturing method thereof. In particular, the present invention relates to a semiconductor device using an oxide semiconductor and a manufacturing method thereof.

Note that in this specification, a semiconductor device refers to any device that can function by utilizing semiconductor characteristics, and an electro-optical device, a semiconductor circuit, and an electronic device are all semiconductor devices.

Furthermore, one embodiment of the present invention relates to a charge control system using an oxide semiconductor, a charge control method, and an electronic device having a secondary battery.

Note that in this specification, a power storage device refers to every element and device having a function of storing power. Examples of the power storage device include a primary battery, a storage battery (also referred to as a secondary battery) such as a lithium-ion secondary battery, a lithium-ion capacitor, an all-solid-state battery, and an electric double layer capacitor.

BACKGROUND ART

In recent years, various power storage devices including lithium-ion secondary batteries, nickel-metal hydride secondary batteries, lithium-ion capacitors, air cells, and the like have been actively developed. In particular, lithium-ion secondary batteries featuring high output and high energy density are used in mobile devices which are, for example, portable information terminals such as mobile phones, smartphones, tablets, and laptop computers; portable music players; digital cameras; and the like. Other than those, lithium-ion secondary batteries are also used in medical equipment; next-generation clean energy vehicles such as hybrid electric vehicles (HEVs), electric vehicles (EVs), and plug-in hybrid vehicles (PHEVs); electric-powered vehicles such as electric motorcycles and motor-assisted bicycles; and the like. Thus, demand for lithium-ion secondary batteries has rapidly grown with the development of the semiconductor industry, and the lithium-ion secondary batteries are essential as rechargeable energy supply sources for the current information society.

A secondary battery is repeatedly charged every time the remaining capacity is reduced through the use by a user. Since the secondary battery deteriorates through the repetition of charging, a way to extend the life of the secondary battery, such as changing the charging condition in accordance with the deterioration degree of the secondary battery, is chosen, for example. Secondary batteries right after manufacture have individual differences, deteriorate as the number of cycles increases, and are influenced by various parameters such as the voltage, charge and discharge current, temperature, and internal resistance of the battery.

Moreover, a secondary battery using lithium ions is known to exhibit thermal runaway with an internal short circuit, overcharge, or the like due to degradation. Abnormality that is a sign of thermal runaway needs to be detected so that safety measures can be taken.

In a portable information terminal, an electric vehicle, or the like, a plurality of secondary batteries connected in series or in parallel and provided with a protection circuit is used as a battery pack (also referred to as an assembled battery). A battery pack refers to a container (a metal can or a film exterior body) in which a battery module composed of a plurality of secondary batteries and a predetermined circuit are stored for easy handling of secondary batteries.

There is no problem as long as all the secondary batteries constituting the assembled battery function normally. However, if abnormality is caused in at least one of the batteries, the other secondary batteries are adversely influenced and a protection circuit may operate to stop the use of the assembled battery.

Furthermore, in a portable information terminal, reductions in the size or thickness of the housing are pursued. The smallness of the housing of the portable information terminal and large capacity of secondary batteries are desired; however, there is a space limitation in the housing.

Conventionally, a protection circuit which prevents overcharge or overdischarge is mounted as an IC chip on a rigid substrate (printed wiring board) in order to secure safety from abnormality of secondary batteries. In addition, a switching circuit for flowing or blocking a discharge current is mounted on another IC chip, and these IC chips are mounted on the rigid substrate in combination. Furthermore, in some cases, the small rigid substrate on which both the IC chip of the protection circuit and the IC chip of the switching circuit are mounted is placed between two terminals of a battery cell, and the rigid substrate and the battery cell which are fixed together with a film form one battery pack.

Patent Document 1 discloses a battery state detection device that detects a minute short circuit of a secondary battery and a battery pack that incorporates it.

In addition, not only single-component metal oxides, such as indium oxide and zinc oxide, but also multi-component metal oxides are known as oxide semiconductors, for example. Among the multi-component metal oxides, in particular, an In—Ga—Zn oxide (also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3).

Non-Patent Document 1 and Non-Patent Document 2 disclose a technique for fabricating a transistor using an oxide semiconductor having a CAAC structure. Moreover, Non-Patent Document 4 and Non-Patent Document 5 disclose that a fine crystal is included even in an oxide semiconductor which has lower crystallinity than an oxide semiconductor having the CAAC structure or the nc structure.

Non-Patent Document 6 reports the extremely low off-state current of a transistor using an oxide semiconductor, and Non-Patent Document 7 and Non-Patent Document 8 report an LSI (Large Scale Integration) and a display which utilize such a property of extremely low off-state current.

REFERENCE

Patent Document

[Patent Document 1] Japanese Published Patent Application No. 2010-66161

Non-Patent Document

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

To simplify the charge operation of a secondary battery, wireless power feeding (also referred to as wireless charging) utilizing wireless transmission of electric power between a power feeding device (charger) and a portable information terminal is spreading.

When a wireless power supply on the transmission side, which is a power feeding device (charger), and a wireless power supply on the reception side of a portable information terminal are made close to each other spatially, energy due to an alternating current magnetic flux generated by the charger is transmitted to a power receiving coil. An alternating current generated from the power receiving coil is sent to a rectifier circuit and converted into a direct current. The wireless power supply on the reception side has at least the power receiving coil and the rectifier circuit. Furthermore, the wireless power supply on the reception side has a charging circuit for conversion into a current or voltage needed to charge a secondary battery, such as a current-voltage converter circuit.

In order to secure safety at the time of charging even in the case of wireless charging, an object is to secure safety in such a manner that abnormality of a secondary battery is detected, for example, a phenomenon that lowers the safety of a secondary battery is detected early, and users are warned or the use of the secondary battery is stopped.

Another object is to provide a structure that includes a circuit for controlling the safe operation of a secondary battery but can overcome space limitations owing to miniaturization of the housing.

Moreover, the life of the secondary battery tends to decrease as the number of charging times increases. Therefore, in order to reduce the number of charging times, it is preferable to increase the charging interval. Specifically, power saving, e.g., turning off the screen, may be performed in a state where the secondary battery is not used (standby state). Since electric power can be fed to a circuit when a power switch is on, it is also desired to control power consumption of such a circuit. Accordingly, increasing the life of a secondary battery by reducing the number of charging times is another object. Furthermore, increasing the battery replacement interval of a primary battery as well as a secondary battery is also an object.

Means for Solving the Problems

In order to achieve the foregoing objects, a charge control circuit is provided over a flexible substrate and bonded to an external surface of a battery. The charge control circuit is electrically connected to at least one of two terminals of the battery and controls charging. In the case where wireless charging is performed, the charge control circuit is further electrically connected to a charging circuit (e.g., a current-voltage converter circuit), a rectifier circuit, a power receiving coil (also referred to as an antenna or a secondary coil), or the like.

To prevent overcharge to a battery, when overcharge is detected, the charge control circuit brings blocking switches provided in two places (the positive side and the negative side) of the battery into off state. In this way, power supply to the battery can be blocked at two positions, and the secondary battery can be protected from overcharge.

One structure of the invention disclosed in this specification is a charge control system which includes a secondary battery, a first transmission path which is connected to a first terminal of the secondary battery and through which electric power output from the secondary battery is transmitted at the time of discharging, a charge control circuit which is connected to the first transmission path and provided over a flexible substrate so as to be in contact with a side surface of the secondary battery, a second transmission path which connects the charge control circuit and a second terminal of the secondary battery, a first switch which blocks the second transmission path, a charging circuit electrically connected to the charge control circuit, a power receiving circuit electrically connected to the charging circuit, an antenna electrically connected to the power receiving circuit, a third transmission path through which electric power is supplied from the power receiving circuit through the charging circuit to the secondary battery at the time of charging, and a second switch which blocks the third transmission path and is an output transistor of the charging circuit. The first switch blocks the second transmission path when the secondary battery is overcharged. In the case where the charge control circuit judges that there is abnormality during charging of the secondary battery, the second transmission path is blocked and charging is stopped. The second switch blocks the third transmission path when the secondary battery is overcharged. The charging circuit notifies the power receiving circuit that charging has been completed.

For charging of a lithium-ion secondary battery using an antenna (secondary coil), wireless charging based on the Qi standard is employed, so that contactless charging is possible with a charger having a primary coil. The device disclosed in this specification is an electronic device having a wireless charging module having a signal communication function based on the Qi standard, and this novel electronic device can receive a signal from an external charger by the wireless charging module having a signal communication function based on the Qi standard.

On the detection of overcharge, the charge control circuit provided over the flexible substrate outputs a signal which brings the first switch and the second switch into off state. Then, transmission of electric power from the primary coil is stopped. Since the stop of the transmission of electric power is possible, wireless charging can prevent overdischarge as compared with wired charging.

To make it possible to reduce the power consumption, the charge control circuit preferably uses a transistor including an oxide semiconductor. The transistor using an oxide semiconductor in its semiconductor layer has an extremely low leakage current in off state. The off-state current of the transistor using an oxide semiconductor, which is normalized by the channel width, can be as low as several yA (yoctoamperes)/μm to several zA (zeptoamperes)/μm.

Furthermore, because a transistor using an oxide semiconductor can be used in a high-temperature environment, the charge control circuit preferably uses the transistor using an oxide semiconductor. For the process simplicity, the charge control circuit may be formed using transistors of the same conductivity type. The operation ambient temperatures of a transistor using an oxide semiconductor in its semiconductor layer are wider than those of a single crystal Si transistor and are higher than or equal to −40° C. and lower than or equal to 150° C., which causes less change of characteristics compared with a single crystal transistor when the secondary battery is heated. The off-state current of the transistor using an oxide semiconductor is lower than or equal to the lower measurement limit even at 150° C. independently of the temperature. On the contrary, the off-state current of the single crystal Si transistor largely depends on the temperature. For example, at 150° C., the off-state current of the single crystal Si transistor rises, and a sufficiently high current on/off ratio cannot be obtained.

A charge control circuit or a battery control system, which has a memory circuit including a transistor using an oxide semiconductor, is referred to as BTOS (Battery operating system), in some cases.

In the case of a cylindrical secondary battery, the flexible substrate can be provided so as to bend and wind around a curved side surface of the secondary battery.

Furthermore, providing the protection circuit, the first switch, and the above-described charge control circuit over the same flexible substrate enables a structure which can overcome space limitations owing to miniaturization of the housing.

As the flexible substrate, an organic resin film or a metal film can be used. Examples of the organic resin film include polyester resins such as PET and PEN, a polyacrylonitrile resin, an acrylic resin, a polyimide resin, a polymethyl methacrylate resin, a PC resin, a PES resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a PTFE resin, and an ABS resin.

Note that stainless steel, aluminum, or the like can be used as the metal film.

In the method for forming the charge control circuit over the flexible substrate, a method in which a charge control circuit is formed over a semiconductor substrate, then separated by a separation method, and fixed onto a flexible substrate is employed. A known technique can be used in the separation method. Alternatively, a method in which a charge control circuit is formed over a semiconductor substrate, a rear surface is polished, and then the circuit is fixed onto a flexible substrate may be employed. Alternatively, a method in which what is called laser cutting, in which partial cutting is performed with the use of laser light, is performed, and then the circuit is fixed onto a flexible substrate may be employed. Alternatively, a method in which a charge control circuit is directly formed over a flexible substrate may be employed. Alternatively, a method in which a charge control circuit formed over a glass substrate is separated by a separation method and then fixed onto a flexible substrate is used.

In this specification, a charge control circuit means a circuit which executes any one or all of the control of the charge voltage and charge current amount, the control of the charge current amount in accordance with the degradation degree, and detection of a micro-short circuit.

A micro-short circuit refers to a minute short circuit in a secondary battery, and is not a short circuit of a positive electrode and a negative electrode of a secondary battery which makes charging and discharging impossible but a phenomenon in which a small amount of short-circuit current flows through a minute short circuit portion. Since a large voltage change occurs even when the time thereof is relatively short and the area thereof is small, the abnormal voltage value might adversely affect the later estimation.

A plurality of charging and discharging causes an uneven distribution of positive electrode active materials, which leads to local concentration of current in part of the positive electrode and the negative electrode, whereby part of a separator stops functioning or a by-product is generated by a side reaction. This is thought to generate a phenomenon called a micro short circuit.

Furthermore, the charge control circuit detects not only a micro-short circuit but also a terminal voltage of the secondary battery and controls the charge and discharge state of the secondary battery. For example, to prevent overcharge, the charge control circuit can bring both the output transistor of the charging circuit and the blocking switch into off state substantially concurrently.

Another one structure of the invention disclosed in this specification is a semiconductor device which includes a secondary battery, a first transmission path which is connected to a first terminal of the secondary battery and through which electric power output from the secondary battery is transmitted at the time of discharging, a charge control circuit which is connected to the first transmission path and provided over a flexible substrate so as to be in contact with a side surface of the secondary battery, a second transmission path which connects the charge control circuit and a second terminal of the secondary battery, a blocking switch which blocks the second transmission path, and a charging circuit electrically connected to the charge control circuit. The charge control circuit controls both the blocking switch and an output transistor of the charging circuit.

The first switch which blocks the second transmission path is a switch for controlling conduction and blocking operations and can also be referred to as a protection circuit. Furthermore, this first switch can form a protection circuit by being combined with a diode. It can be said that double protection is made by such a protection circuit and the above-described charge control circuit; thus, the semiconductor device has high safety.

The first switch (also referred to as a blocking switch) can also be formed using a transistor that uses an oxide semiconductor.

Furthermore, to prevent overcharge, the second switch which is an output transistor of the charging circuit and blocks the third transmission path can be formed of a transistor that uses an oxide semiconductor.

In this specification, a protection circuit means a circuit which executes any one or all of prevention of overcharge, prevention of an overcurrent, and prevention of overdischarge. The blocking switch for blocking charging is included in the protection circuit, in some cases.

A flexible substrate provided with the above-described charge control circuit can be incorporated in not only batteries but also card-shaped electronic money, RFID (Radio Frequency Identification) tags, and the like.

Effect of the Invention

Blocking two paths which connect to a battery can quickly stop charging when overcharge is detected and reduce damage to the battery owing to the overcharge.

When one flexible sheet provided on a side surface of a battery is provided with a protection circuit, a charge control circuit, and an abnormality detection circuit, a printed board on which these circuits are mounted as a plurality of IC chips is not needed, achieving a miniaturized electronic device without reducing the functions.

BRIEF DESCRIPTION OF THE DRAWINGS

FIG. 10A is a top view illustrating a structure example of a transistor, and FIG. 10B and FIG. 10C are cross-sectional views illustrating the structure example of the transistor.

MODE FOR CARRYING OUT THE INVENTION

Embodiments of the present invention are described in detail below with reference to the drawings. Note that the present invention is not limited to the following description, and it is readily understood by those skilled in the art that modes and details of the present invention can be modified in various ways. In addition, the present invention should not be construed as being limited to the description of the embodiments below.

Embodiment 1

Figure 1A:
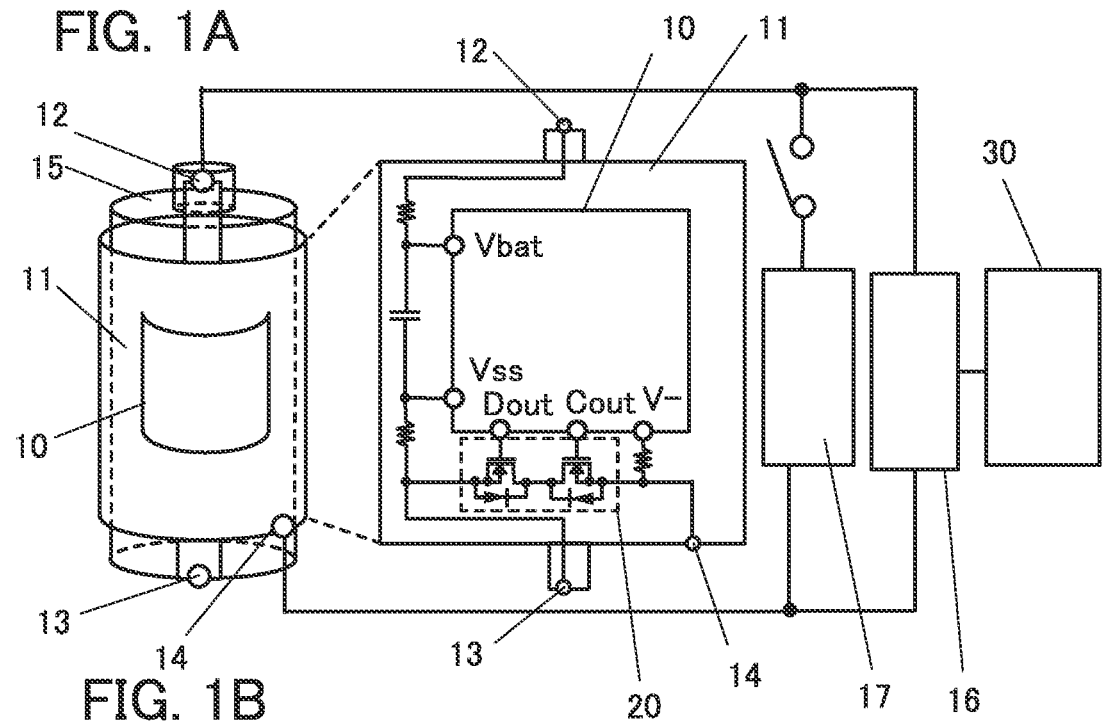
FIG. 1A, FIG. 1B, and FIG. 1C are conceptual diagrams illustrating one embodiment of the present invention.

FIG. 1A is a conceptual diagram of a charge control system for wireless charging, where a charge control circuit 10 formed over a flexible substrate 11, which is a flexible film, is mounted on a cylindrical secondary battery 15. Note that in FIG. 1A, Vbat is a voltage of the secondary battery, Vss and V− are voltages of the charge control circuit, and Dout and Cout are output terminals. The charge control system includes at least the cylindrical secondary battery 15, the charge control circuit 10, a first switch 20, a charging circuit 16, and an antenna 30.

The cylindrical secondary battery 15 includes a first terminal 12 on the top surface and a second terminal 13 on the bottom surface. A first transmission path which is connected to the first terminal 12 of the cylindrical secondary battery and through which electric power output from the cylindrical secondary battery 15 is transmitted is electrically connected to a terminal of the charge control circuit through an electrode 18. Furthermore, a second transmission path connected to the second terminal 13 of the cylindrical secondary battery is connected to the first switch 20 which blocks the second transmission path through an electrode 19.

In FIG. 1A, two switching diodes formed of a transistor and a diode are connected as the first switch 20 (also referred to as a blocking switch) which blocks the second transmission path and function as a protection circuit for preventing overdischarge, overcharge, or an overcurrent. The first switch 20 controls conduction and blocking operations and can also be referred to as a switching means that switches between supply and blocking. A third terminal 14, which is the other terminal of the second transmission path and formed over the flexible substrate 11, is connected to the charging circuit 16 and an electronic device 17.

In addition, a third transmission path through which electric power is supplied from the antenna 30 (or the power receiving circuit) through the charging circuit 16 to the cylindrical secondary battery 15 at the time of charging is also provided.

In the method for forming the charge control circuit 10 over the flexible substrate 11, a method in which the charge control circuit is formed over a semiconductor substrate, then separated by a separation method, and fixed onto the flexible substrate 11 is employed. A known technique can be used in the separation method. Alternatively, a method in which the charge control circuit is formed over a semiconductor substrate, a rear surface is polished, and then the circuit is fixed onto the flexible substrate 11 may be employed. Alternatively, a method in which what is called laser cutting, in which partial cutting is performed with the use of laser light, is performed, and then the circuit is fixed onto the flexible substrate 11 may be employed. Alternatively, a method in which the charge control circuit 10 is directly formed over the flexible substrate 11 may be employed. Alternatively, a method in which the charge control circuit 10 formed over a glass substrate is separated by a separation method and then fixed onto the flexible substrate 11 may be used.

Although the example in which the first switch 20 formed of these switching diodes is also formed or mounted over the flexible substrate 11 is shown in this embodiment, the structure is not particularly limited thereto.

In the case where abnormality such as a micro-short circuit is detected by the charge control circuit 10, a signal is input to a gate of the first switch 20 which blocks the second transmission path, so that the second transmission path can be blocked. By blocking the second transmission path, the supply of a current from the charging circuit 16 or the supply of a current to the electronic device 17 can be stopped. Furthermore, when a signal voltage applied to the gate of the switch 20 which blocks the second transmission path is retained in a memory circuit (including a transistor using an oxide semiconductor), blocking can be maintained for a long time.

Furthermore, in the case where abnormality such as a micro-short circuit is detected, at the time of blocking the second transmission path, an output transistor (a second switch) of the charging circuit 16 is brought into off state to block the third transmission path, so that a signal indicating the stop of electric power transmission can be transmitted from the antenna 30 to stop transmission of electric power. Accordingly, a highly safe charge control system can be achieved.

Figure 1B:
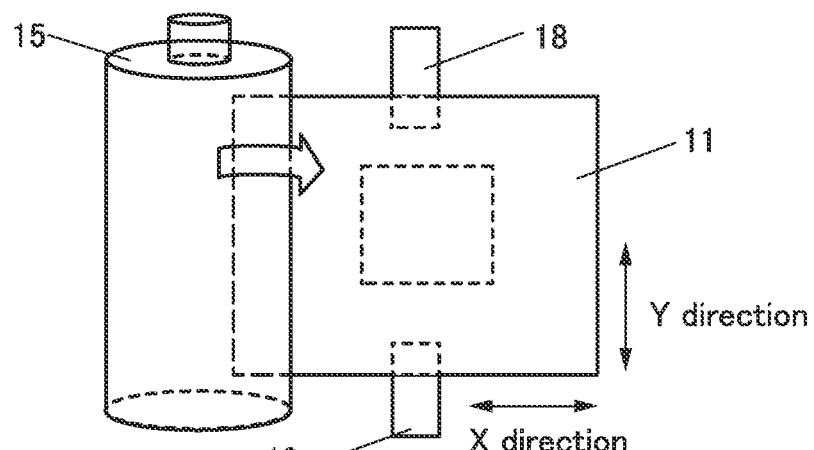
Figure 1C:
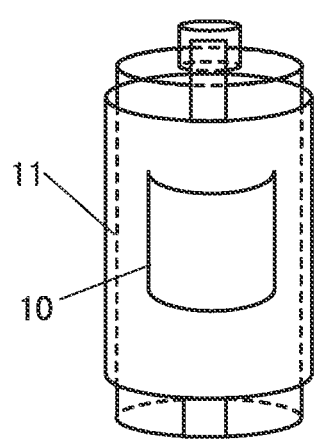

FIG. 1B is a diagram illustrating a step right before bonding of the cylindrical secondary battery 15 and the flexible substrate 11 and illustrates the contact surface side of the flexible substrate 11. As illustrated in FIG. 1B, the body of the cylindrical secondary battery 15 is put and rolled on the contact surface of the flexible substrate 11, so that the flexible substrate 11 winds around and attaches to the body in the circumference direction. Although the electrode 18 and the electrode 19 are disposed in Y direction over the flexible substrate 11, without particular limitation, one of them may be displaced in X direction. Note that FIG. 1C is a diagram illustrating the state after rolling.

An exterior film is equipped to cover an outer peripheral surface of the body of the cylindrical secondary battery 15. This exterior film is used to protect a metal can which seals the internal structure of the secondary battery and keep the insulation from the metal can.

In the case where such an exterior film is not used and the outer surface (excluding the terminal portion) of the cylindrical secondary battery 15 is a metal surface, it is preferable to provide an insulating sheet between the metal surface and the electrode 18 and between the metal surface and the electrode 19. The electrode 18 or the electrode 19 is conductive metal foil, a conductive tape formed of a conductive material, or a lead wire and is connected to the terminals of the cylindrical secondary battery 15 by a known method such as soldering or a wire bonding method. Furthermore, the electrode 18 or the electrode 19 is connected to the terminals of the charge control circuit 10 by soldering or a wire bonding method.

In the case where a protection circuit in which IC chips are mounted on a circular rigid substrate overlapping with the bottom surface of a cylindrical secondary battery is used in a conventional manner, the protection circuit is fitted into a socket to be in contact with a spring; this might cause a failure owing to application of physical stress. In the present invention, the circuit is provided on the side surface of the cylindrical secondary battery and the applied physical stress is lower than that in the conventional cylindrical secondary battery. Conventionally, in accordance with the space of the circular rigid substrate disposed on the bottom, the size of the battery needs to be reduced and the capacity is reduced accordingly. Since the circuit is provided on the side surface of the cylindrical secondary battery in the present invention, the capacity is not reduced from the conventional and space saving can be achieved as well.

Thus, it is effective to provide the charge control circuit 10 or the protection circuit in a curved surface region in the side surface of the cylindrical secondary battery 15. For example, in the case of a 18650 battery with a diameter of 18 mm and a length of 65 mm, the area of the flexible substrate 11 is smaller than or substantially equal to the area of the side surface of the cylindrical secondary battery (the length in X direction is 3.14×18 mm and the length in Y direction is 65 mm). Furthermore, in the case of a 26650 battery with a diameter of 26 mm and a length of 65 mm, the area of the flexible substrate 11 is such that the length in X direction is 3.14×26 mm and the length in Y direction is 65 mm.

Moreover, in the case where the cylindrical secondary battery 15 is a 18650 battery, the curved surface region of the bonded flexible substrate 11 has a curvature radius of approximately 9 mm. Because the curvature radius might not be uniformly approximately 9 mm owing to the influence of a circuit and a wiring provided over the flexible substrate 11, the curvature radius of a surface refers to the smallest curvature radius in this specification and the like. In the case where the curved surface has a shape having a plurality of centers of curvature, the curvature radius refers to a curvature radius of a curved surface having the smallest curvature radius among curvature radii with respect to the plurality of centers of curvature. Although it depends on the size of the cylindrical secondary battery 15, the flexible substrate 11 can be bent with a curvature radius range of 30 mm or more, preferably a curvature radius range of 9 mm or more.

Figure 2A:
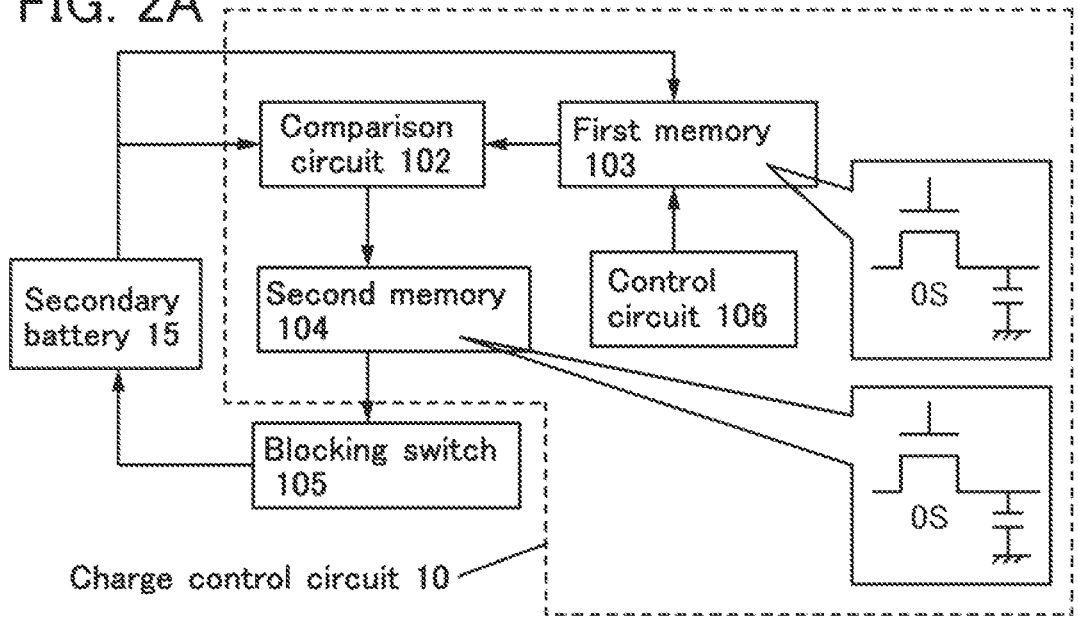
FIG. 2A is an example of a block diagram illustrating one embodiment of the present invention.

Furthermore, FIG. 2A illustrates an example of a block diagram of a specific circuit of the charge control circuit 10.

As illustrated in FIG. 2A, the charge control circuit 10 of the secondary battery 15 includes at least a comparison circuit 102, a first memory 103, a second memory 104, and a control circuit 106.

Although the secondary battery 15 and a blocking switch 105 (first switch) are illustrated separately from the charge control circuit 10 in FIG. 2A, the blocking switch 105 and the charge control circuit 10 can be formed over the same substrate as well.

The comparison circuit 102 compares two input voltages in size and produces output. As the comparison circuit 102, a single-polarity circuit using a transistor that includes an oxide semiconductor in its channel formation region can also be used.

The first memory 103 is an analog memory and stores an offset analog potential of the secondary battery. The data of the offset voltage value of the secondary battery can be created with the use of parasitic capacitance generated between a gate electrode and a drain electrode of a transistor of the first memory 103 by application of a write signal to the gate. The first memory 103 is formed of one transistor including an oxide semiconductor in its channel formation region and a capacitor. The first memory 103 can also be referred to as a high-accuracy charge voltage monitor circuit. Furthermore, the first memory 103 can take advantage of the low leakage current of the transistor including an oxide semiconductor in its channel formation region.

The second memory 104 has an element structure similar to that of the first memory 103 and is formed of one transistor including an oxide semiconductor (OS) in its channel formation region and a capacitor. The second memory 104 retains data of the blocking switch 105 (first switch).

The blocking switch 105 (first switch) is a switch for blocking the supply of electric power to a power source of a secondary battery where abnormality has been generated. With the circuit configuration illustrated in FIG. 2A, the blocking switch 105 can prevent the secondary battery 15 where abnormality has been generated from being charged continuously and thus can prevent firing due to overcharge. Furthermore, by bringing the output transistor of the charging circuit in off state, the charge control circuit 10 can reduce the risk of overcharge.

Although FIG. 2A illustrates an example in which the supply of electric power to the secondary battery 15 is stopped with the blocking switch 105 (first switch) after abnormality detection, the charging condition may be changed, charging may be stopped for a while, or a warning may be displayed in accordance with the number of times abnormality has been detected, for example.

Figure 2B:
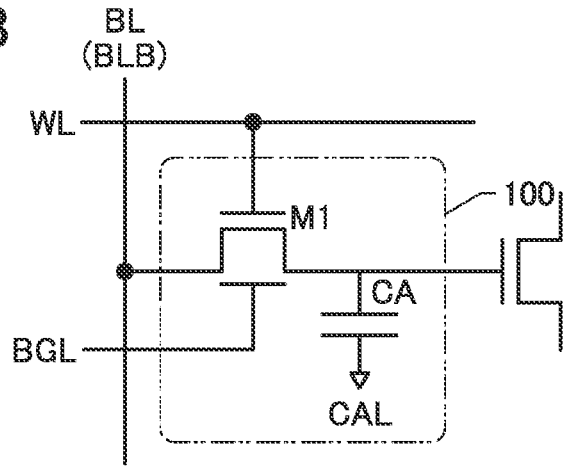
FIG. 2B is a circuit configuration example.

A memory cell that can be used in the first memory 103 and the second memory 104 in FIG. 2A is shown in FIG. 2B. FIG. 2B shows a circuit configuration example of a memory cell 100 with a transistor including a back gate.

The memory cell 100 includes a transistor M1 and a capacitor CA. Note that the transistor M1 includes a front gate (also simply referred to as a "gate") and a back gate. The back gate is placed so that a channel formation region of a semiconductor layer is sandwiched between the gate and the back gate. Note that the gate and the back gate are named for convenience; when one is referred to as a "gate", the other is referred to as a "back gate". Thus, the names "gate" and "back gate" can be interchanged with each other. One of a gate and a back gate is referred to as a "first gate" and the other is referred to as a "second gate", in some cases.

One of a source and a drain of the transistor M1 is electrically connected to one electrode of the capacitor CA. The other of the source and the drain of the transistor M1 is electrically connected to a bit line BL or a bit line BLB. The gate of the transistor M1 is electrically connected to a word line WL, and the back gate of the transistor M1 is electrically connected to a wiring BGL. The other electrode of the capacitor CA is connected to a wiring CAL.

The wiring CAL functions as a wiring for applying a predetermined potential to the other electrode of the capacitor CA. At the time of data writing and data reading, a fixed potential such as VSS is preferably supplied to the wiring CAL.

The wiring BGL functions as a wiring for applying a potential to the back gate of the transistor M1.

Figure 2C:
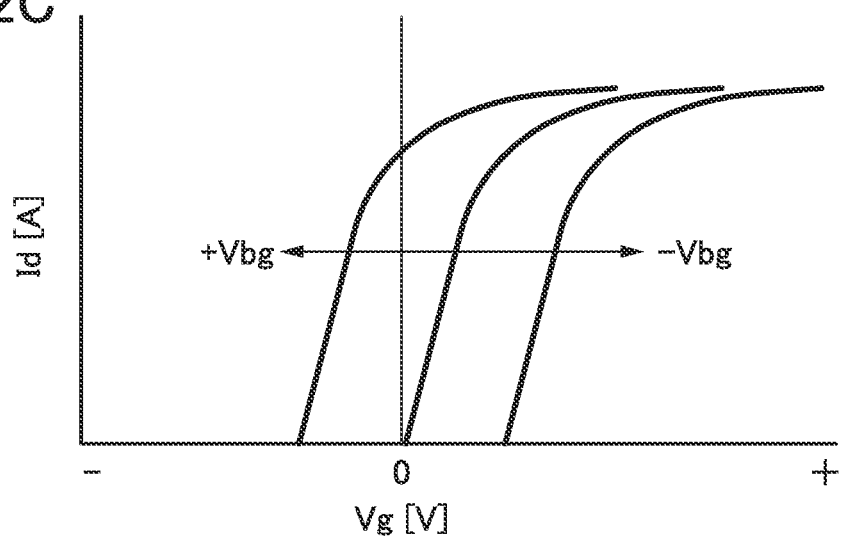
FIG. 2C is a diagram showing Id-Vg characteristics of a transistor.

FIG. 2C shows an example of Id-Vg characteristics, one of electrical characteristics of a transistor. The Id-Vg characteristics show a change in drain current (Id) with respect to a change in gate voltage (Vg). The horizontal axis in FIG. 2C represents Vg on a linear scale. The vertical axis in FIG. 2C represents Id on a log scale. As shown in FIG. 2C, when a positive bias voltage +Vbg is supplied to the wiring BGL as a back gate voltage (Vbg), Id-Vg characteristics shift in the negative Vg direction. When a negative bias voltage −Vbg is supplied to the wiring BGL, Id-Vg characteristics shift in the positive Vg direction. The shift amount of the Id-Vg characteristics depends on the voltage supplied to the wiring BGL. By adjustment of the voltage applied to the wiring BGL, the threshold voltage of the transistor M1 can be increased or decreased.

Data writing and reading are performed in such a manner that a potential that brings the transistor M1 into a conduction state (on state) is supplied to the word line WL to bring the transistor M1 into a conduction state and the bit line BL or the bit line BLB and the one electrode of the capacitor CA are electrically connected to each other.

The use of an OS transistor as the transistor M1 enables the leakage current of the transistor M1 to be extremely low. That is, with the use of the transistor M1, written data can be retained for a long time, and thus the frequency of the refresh operation for the memory cell can be decreased. Furthermore, refresh operation for the memory cell can be omitted. Owing to an extremely low leakage current, the memory cell can retain analog data.

In the case where electric power is supplied from the cylindrical secondary battery 15 to the electronic device 17 as illustrated in FIG. 1A, the cylindrical secondary battery 15 is in a discharging state. The charge control circuit 10 monitors the behavior of a voltage, a current, and the like of the first terminal 12 and the second terminal 13, and when abnormality is detected, the second transmission path is blocked by the first switch 20 and discharging stops.

The electronic device 17 refers to the structure except the secondary battery, and the power source for the electronic device 17 is the cylindrical secondary battery 15. Note that the electronic device 17 includes a portable mobile device that can be carried around.

Furthermore, in the case where the cylindrical secondary battery 15 is charged by wireless supply of electric power, the cylindrical secondary battery 15 is in a charging state. The charge control circuit 10 monitors the behavior of the voltage, the current, and the like of the first terminal 12 and the second terminal 13, and when abnormality is detected, the second transmission path and the third transmission path are blocked and charging stops.

The charging circuit 16 refers to a circuit which performs transmission of electric power with a wireless signal. Note that the charging circuit 16 is contained in the electronic device 17, in some cases.

Figure 4A:
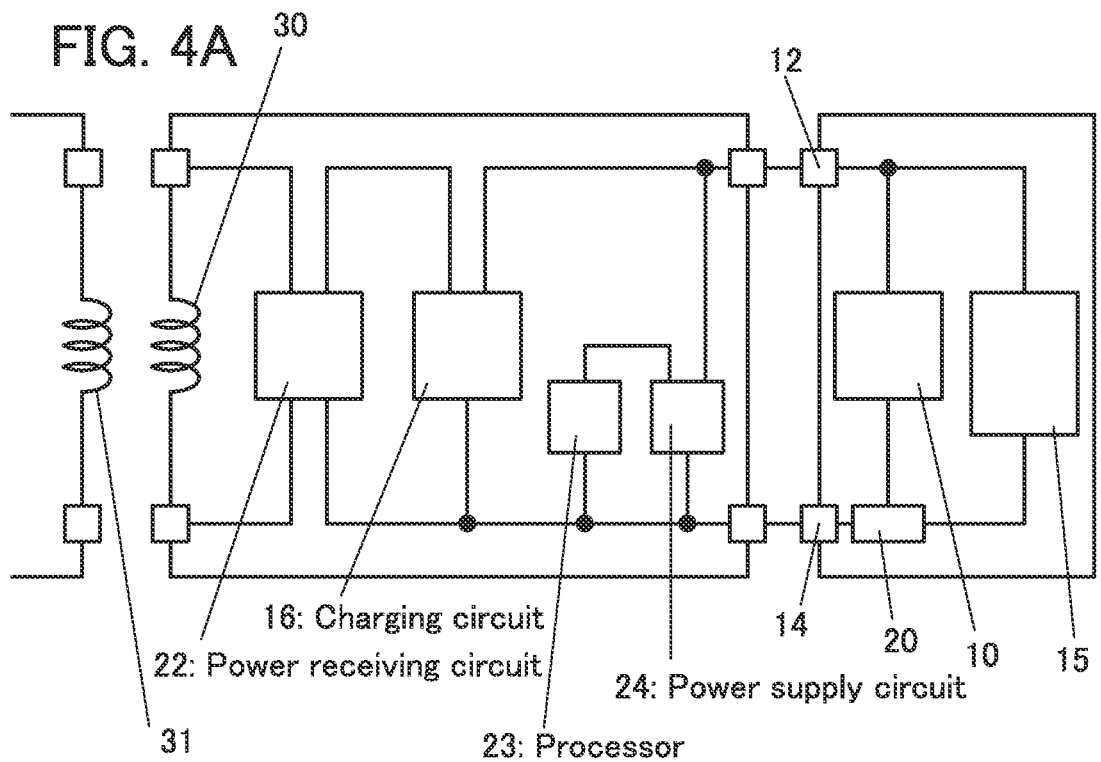
FIG. 4A and FIG. 4B are an example of a block diagram and an example of a flowchart showing one embodiment of the present invention.

An example in which the charging circuit 16 is contained in the electronic device 17 is described. The electronic device 17 contains a rigid substrate on which a plurality of circuits are mounted, and the power source of the electronic device 17 is the battery which the charge control circuit winds around. FIG. 4A is a block diagram illustrating a processor 23, a power supply circuit 24, the charging circuit 16, a power receiving circuit 22, and the like mounted on the rigid substrate. Note that for portions common to FIG. 4A and FIG. 1A, the same reference numerals are used. Note that in FIG. 4A, a primary coil 31 and a secondary coil (the antenna 30) serving as antenna modules are electrically connected to terminals of the rigid substrate.

Figure 4B:
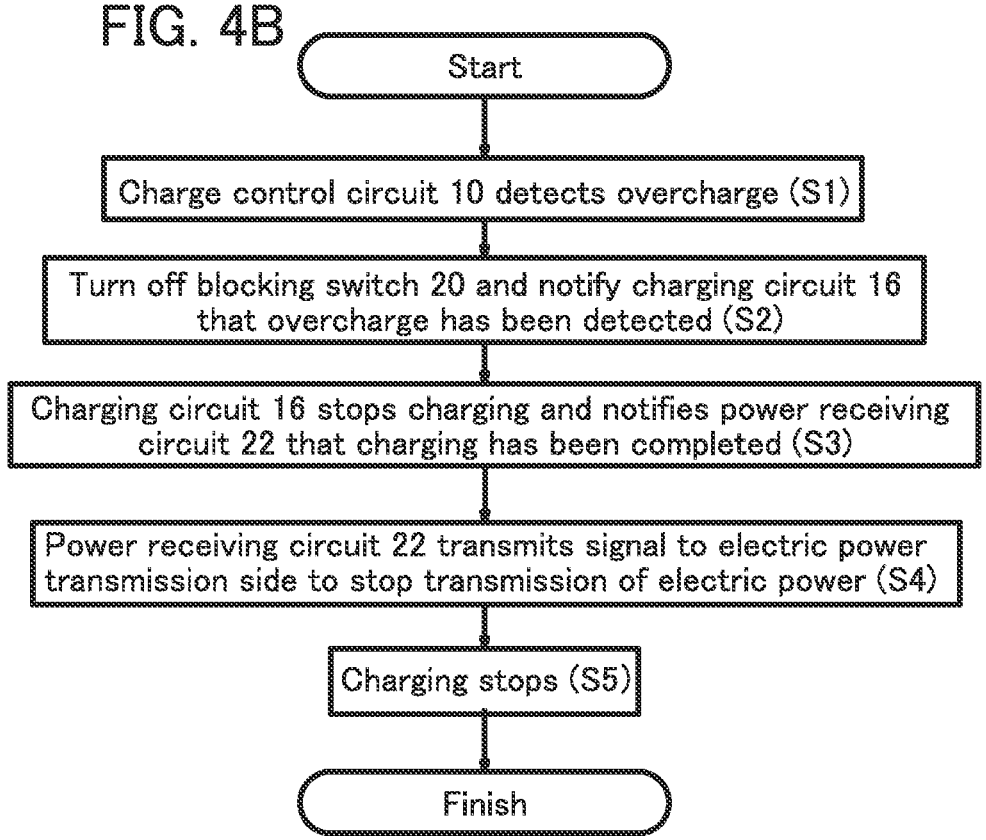

FIG. 4B shows an example of a flowchart in the charge control system in the case where overcharge is detected in one charging operation for the electronic device 17 having the secondary battery 15 on which the charge control circuit 10 is mounted.

First, the charge control circuit 10 detects overcharge (S1). Then, the charge control circuit 10 turns off the first switch 20, which is a blocking switch, and notifies the charging circuit 16 that overcharge has been detected (S2).

Next, the output transistor of the charging circuit 16 is turned off, so that the charging circuit 16 stops charging and notifies the power receiving circuit 22 that charging has been completed (S3). The power receiving circuit 22 transmits a signal to the electric power transmission side, so that the transmission of electric power is stopped (S4). Lastly, transmission from the primary coil 31 is stopped; thus, charging is stopped (S5).

Although the structure of detecting overcharge is mainly described here, without particular limitation, prevention of an overcurrent, detection of abnormality such as a micro-short circuit, and the like may be performed in the same process.

With the above-described charge control system, a plurality of circuits can be stopped at almost the same time after abnormality detection.

Figure 3A:
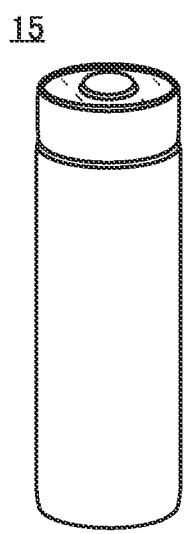
FIG. 3A, FIG. 3B, and FIG. 3C are perspective views and a conceptual diagram illustrating one embodiment of the present invention.
Figure 3B:
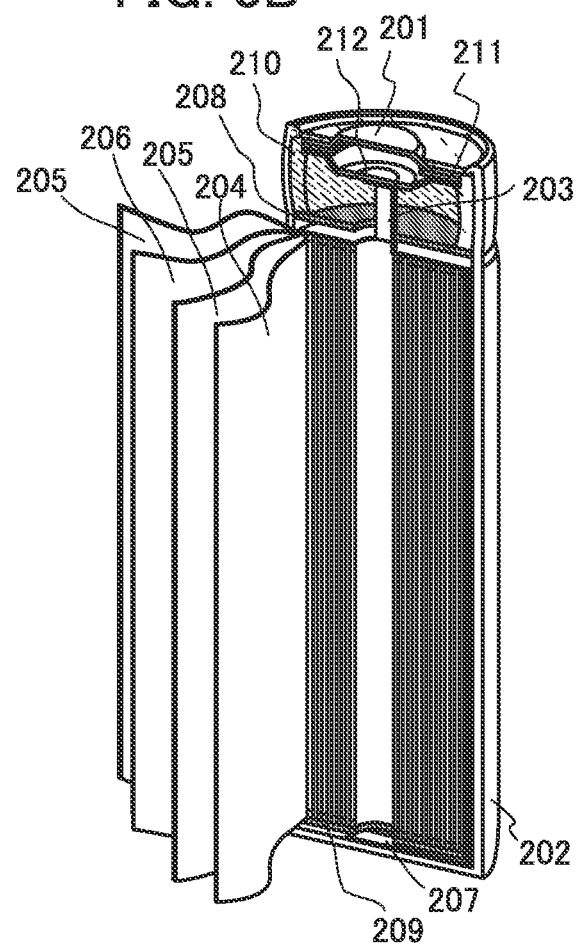

Here, a cylindrical secondary battery is described with reference to FIG. 3A and FIG. 3B. The cylindrical secondary battery 15 includes, as illustrated in FIG. 3B, a positive electrode cap (battery lid) 201 on the top surface and a battery can (outer can) 202 on the side surface and the bottom surface. The positive electrode cap and the battery can (outer can) 202 are insulated by a gasket (insulating gasket) 210.

FIG. 3B is a diagram schematically showing a cross section of the cylindrical secondary battery. Inside the battery can 202 having a hollow cylindrical shape, a battery element in which a belt-like positive electrode 204 and a belt-like negative electrode 206 are wound with a separator 205 located therebetween is provided. Although not shown, the battery element is wound centering around a center pin. One end of the battery can 202 is closed and the other end thereof is opened. For the battery can 202, a metal having corrosion resistance to an electrolyte solution, such as nickel, aluminum, or titanium, an alloy of such a metal, or an alloy of such a metal and another metal (e.g., stainless steel or the like) can be used. The battery can 202 is preferably covered with nickel, aluminum, or the like in order to prevent corrosion due to the electrolyte solution. Inside the battery can 202, the battery element in which the positive electrode, the negative electrode, and the separator are wound is sandwiched between a pair of insulating plates 208 and 209 that face each other. Furthermore, a nonaqueous electrolyte solution (not illustrated) is injected inside the battery can 202 provided with the battery element. The secondary battery is composed of a positive electrode containing an active material such as lithium cobalt oxide ($LiCoO_2$) or lithium iron phosphate ($LiFePO_4$), a negative electrode composed of a carbon material such as graphite capable of occluding and releasing lithium ions, a nonaqueous electrolytic solution in which an electrolyte composed of a lithium salt such as $LiBF_4$ or $LiPF_6$ is dissolved in an organic solvent such as ethylene carbonate or diethyl carbonate, and the like.

Since the positive electrode and the negative electrode of the cylindrical secondary battery are wound, active materials are preferably formed on both sides of current collectors. A positive electrode terminal (positive electrode current collector lead) 203 is connected to the positive electrode 204, and a negative electrode terminal (negative electrode current collector lead) 207 is connected to the negative electrode 206. For both the positive electrode terminal 203 and the negative electrode terminal 207, a metal material such as aluminum can be used. The positive electrode terminal 203 and the negative electrode terminal 207 are resistance-welded to a safety valve mechanism 212 and the bottom of the battery can 202, respectively. The safety valve mechanism 212 is electrically connected to the positive electrode cap 201 through a PTC (positive temperature coefficient) element 211. The safety valve mechanism 212 cuts off electrical connection between the positive electrode cap 201 and the positive electrode 204 when the internal pressure of the battery exceeds a predetermined threshold. In addition, the PTC element 211 is a thermally sensitive resistor whose resistance increases as temperature rises, and limits the amount of current by increasing the resistance to prevent abnormal heat generation. Barium titanate ($BaTiO_3$)-based semiconductor ceramics or the like can be used for the PTC element.

A lithium-ion secondary battery using an electrolyte solution includes a positive electrode, a negative electrode, a separator, an electrolyte solution, and an exterior body. Note that in a lithium-ion secondary battery, the anode and the cathode are interchanged in charging and discharging, and the oxidation reaction and the reduction reaction are interchanged; thus, an electrode with a high reaction potential is called the positive electrode and an electrode with a low reaction potential is called the negative electrode. For this reason, in this specification, the positive electrode is referred to as a "positive electrode" or a "+ electrode (plus electrode)" and the negative electrode is referred to as a "negative electrode" or a "− electrode (minus electrode)" in all the cases where charge is performed, discharge is performed, a reverse pulse current is supplied, and a charge current is supplied. The use of terms an "anode" and a "cathode" related to oxidation reaction and reduction reaction might cause confusion because the anode and the cathode interchange in charging and in discharging. Thus, the terms "anode" and "cathode" are not used in this specification. If the term the "anode" or the "cathode" is used, it should be clearly mentioned that the anode or the cathode is which of the one in charging or in discharging and corresponds to which of the positive electrode (plus electrode) or the negative electrode (minus electrode).

Figure 3C:
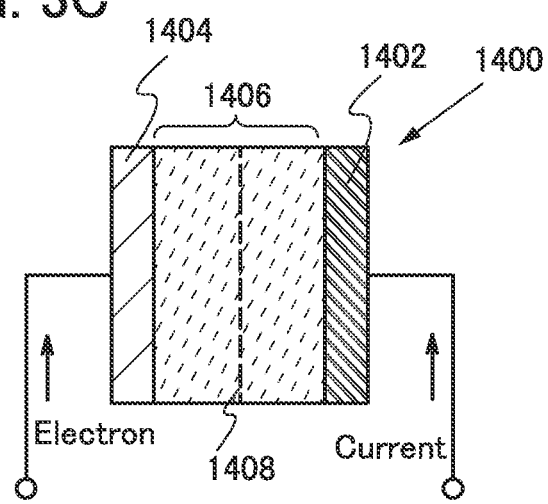

A charger is connected to two terminals shown in FIG. 3C to charge a storage battery 1400. In FIG. 3C, 1406 denotes an electrolyte solution and 1408 denotes a separator. As the charging of the storage battery 1400 proceeds, a potential difference between electrodes increases. The positive direction in FIG. 3C is the direction in which a current flows from a terminal outside the storage battery 1400 to a positive electrode 1402; from the positive electrode 1402 to a negative electrode 1404 in the storage battery 1400; and from the negative electrode to a terminal outside the storage battery 1400. In other words, the direction in which a charge current flows is regarded as the direction of a current.

In this embodiment, an example of a lithium-ion secondary battery is shown; however, it is not limited to a lithium-ion secondary battery and a material including an element A, an element X, and oxygen can be used as a positive electrode material for the secondary battery. The element A is preferably one or more selected from the Group 1 elements and the Group 2 elements. As the Group 1 element, for example, an alkali metal such as lithium, sodium, or potassium can be used. In addition, as the Group 2 element, for example, calcium, beryllium, magnesium, or the like can be used. As the element X, for example, one or more selected from metal elements, silicon, and phosphorus can be used. The element X is preferably one or more selected from cobalt, nickel, manganese, iron, and vanadium. Typical examples include lithium-cobalt composite oxide ($LiCoO_2$) and lithium iron phosphate ($LiFePO_4$).

The negative electrode includes a negative electrode active material layer and a negative electrode current collector. The negative electrode active material layer may contain a conductive additive and a binder.

For the negative electrode active material, an element that enables charge-discharge reaction by alloying reaction and dealloying reaction with lithium can be used. For example, a material containing at least one of silicon, tin, gallium, aluminum, germanium, lead, antimony, bismuth, silver, zinc, cadmium, indium, and the like can be used. Such elements have higher capacity than carbon. In particular, silicon has a high theoretical capacity of 4200 mAh/g.

In addition, the secondary battery preferably includes a separator. As the separator, for example, fiber containing cellulose such as paper; nonwoven fabric; glass fiber; ceramics; synthetic fiber using nylon (polyamide), vinylon (polyvinyl alcohol-based fiber), polyester, acrylic, polyolefin, or polyurethane; or the like can be used.

Embodiment 2

In this embodiment, another structure example of the cylindrical secondary battery of Embodiment 1 will be described with reference to FIG. 5 and FIG. 6.

Figure 5A:
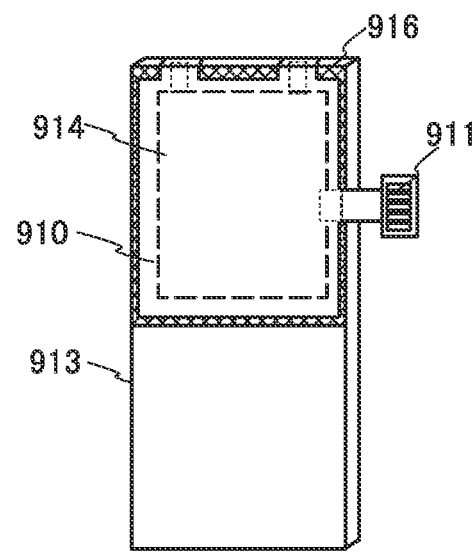
FIG. 5A and FIG. 5B are conceptual diagrams illustrating one embodiment of the present invention.

FIG. 5A is a diagram illustrating an external view of a battery pack which includes a secondary battery 913 having a flat shape, a charge control circuit 914, and a connection terminal 911.

The charge control circuit 914 is formed over or fixed to a flexible substrate 910. The charge control circuit 914 detects abnormality such as a micro-short circuit. Furthermore, the charge control circuit 914 may have a function of a protection circuit for protecting the secondary battery 913 from overcharge, overdischarge, and an overcurrent.

As the charge control circuit 914, the charge control circuit 10 described in Embodiment 1 can be used. Since the same circuit structure and the like can be used, the detailed description thereof is omitted here.

In addition to the charge control circuit 914, the antenna and the power receiving circuit as illustrated in FIG. 4A may be provided. Contactless charging of the secondary battery 913 can also be performed using the antenna. Note that the shape of the antenna is not limited to a coil shape and may be a linear shape or a plate shape, for example. An antenna such as a planar antenna, an aperture antenna, a traveling-wave antenna, an EH antenna, a magnetic-field antenna, or a dielectric antenna may be used. The antenna has a function of communicating data with an external device, for example. As a system for communication using the antenna between the battery pack and another device, a response method that can be used between the battery pack and another device, such as NFC, can be employed.

Figure 5B:
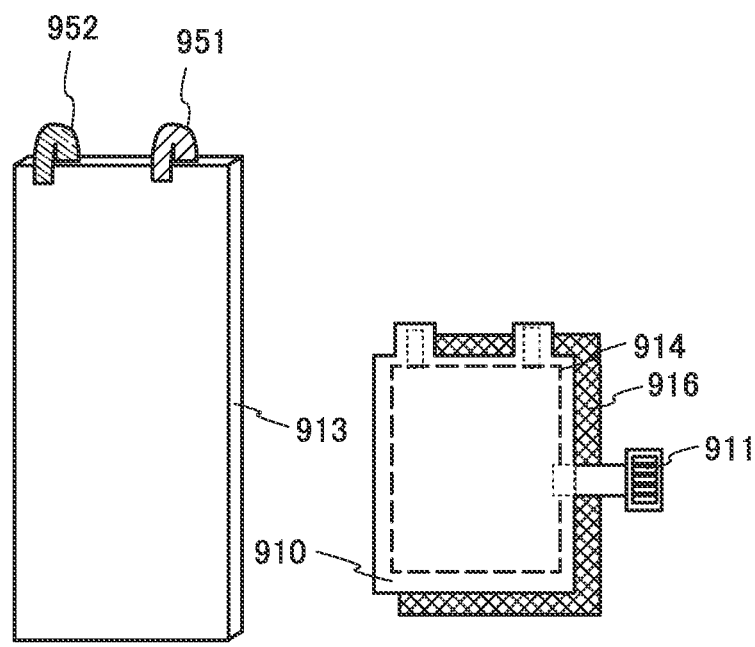

As illustrated in FIG. 5B, the connection terminal 911 is electrically connected to the terminal 951 and the terminal 952 of the secondary battery 913 through the charge control circuit 914. Note that a plurality of connection terminals 911 serving as a control signal input terminal, a power supply terminal, and the like may be provided.

The battery pack includes an insulating sheet layer 916 between the secondary battery 913 and the charge control circuit 914. The insulating sheet layer 916 has a function of, for example, preventing a short circuit owing to the secondary battery 913. For example, an organic resin film or an adhesive sheet can be used for the insulating sheet layer 916.

Furthermore, an internal structure example of the secondary battery 913 is described with reference to FIG. 6.

Figure 6A:
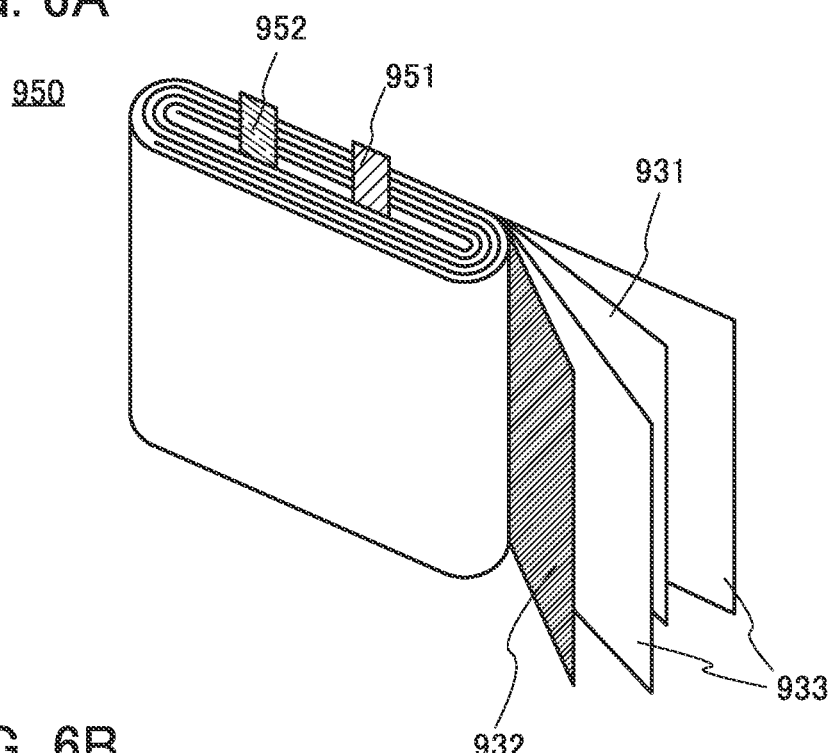
FIG. 6A and FIG. 6B are perspective views illustrating one embodiment of the present invention.

The structure of a wound body 950 provided inside the secondary battery 913 is illustrated in FIG. 6A. The wound body 950 includes a negative electrode 931, a positive electrode 932, and separators 933. The wound body 950 is obtained by winding a sheet of a stack in which the negative electrode 931 overlaps with the positive electrode 932 with the separator 933 provided therebetween. Note that a plurality of stacks each including the negative electrode 931, the positive electrode 932, and the separator 933 may be stacked.

The negative electrode 931 is connected to the connection terminal 911 illustrated in FIG. 5 via one of the terminals 951 and 952. The positive electrode 932 is connected to the connection terminal 911 illustrated in FIG. 5 via the other of the terminals 951 and 952.

The wound body 950 illustrated in FIG. 6A is immersed in an electrolyte solution inside the exterior body. As the exterior body, a housing formed of a metal is used. A film may be used as the exterior body, in which case the film may be provided with a charge control circuit formed over a flexible substrate.

Figure 6B:
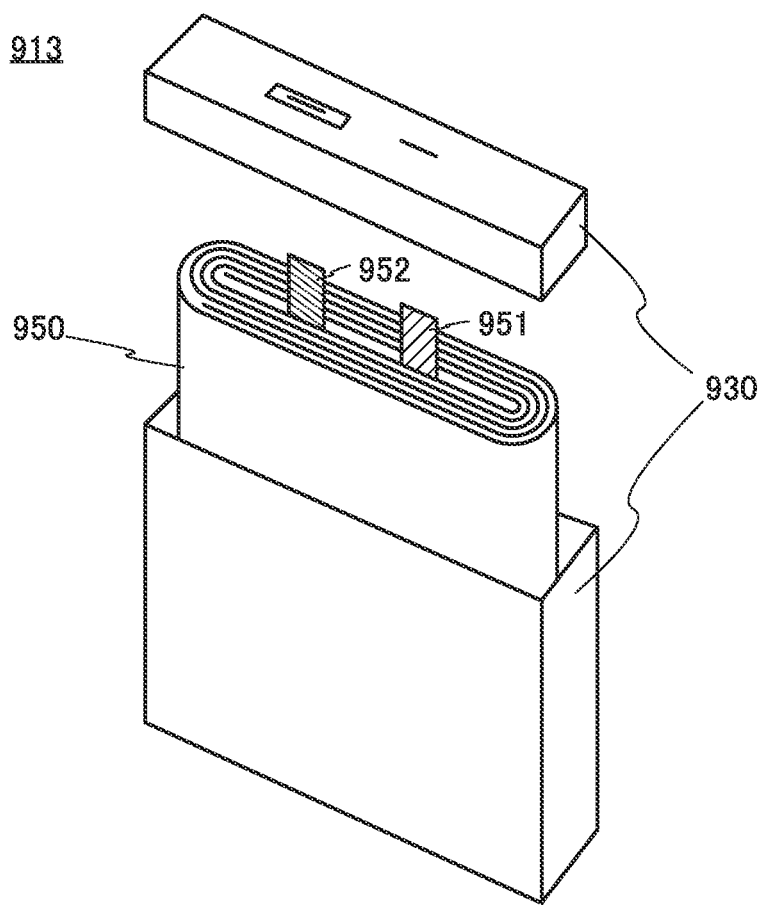

The secondary battery 913 illustrated in FIG. 6B includes a wound body 950 provided with the terminal 951 and the terminal 952 inside a housing 930. The wound body 950 is soaked in an electrolyte solution inside the housing 930. The terminal 952 is in contact with the housing 930. An insulator or the like inhibits contact between the terminal 951 and the housing 930. Note that in FIG. 6B, the housing 930 that has been divided is illustrated for convenience; however, in reality, the wound body 950 is covered with the housing 930, and the terminal 951 and the terminal 952 extend to the outside of the housing 930. For the housing 930, a metal material (e.g., aluminum) or a resin material can be used.

For the housing 930, an insulating material such as a metal material or an organic resin can be used.

FIG. 5A illustrates an example in which the insulating sheet layer 916 is provided on a surface of the housing and the flexible substrate is fixed with a surface provided with the charge control circuit positioned on the inner side; however, without particular limitation, the surface provided with the charge control circuit may be positioned on the outer side and be connected to the terminal 951 and the terminal 952. In such a case, however, the connection portion is exposed, and caution should be taken to do assembly without danger of electrostatic breakdown or a short circuit.

Because the charge control circuit 914 electrically connected to the connection terminal 911 is the charge control circuit 10 described in Embodiment 1, the secondary battery 913 can have high safety.

This embodiment can be freely combined with Embodiment 1.

Embodiment 3

In this embodiment, a structure example of an OS transistor that can be used in the charge control circuit 10 described in the above embodiment will be described. Note that the OS transistor is a thin film transistor and can be formed over a separation layer provided over a glass substrate or stacked over a single crystal silicon substrate.

Embodiment 1 shows an example in which a flexible substrate provided with a charge control circuit is bonded to a curved surface of a secondary battery, where an OS transistor formed over a separation layer provided over a glass substrate is fixed to the flexible substrate by a known separation method. Furthermore, Embodiment 2 shows an example in which a charge control circuit is bonded to a flat surface of a secondary battery, where after an OS transistor is formed over a single crystal silicon substrate, a rear surface of the single crystal silicon substrate is polished and the thinned single crystal silicon substrate is fixed to a flexible substrate, for example. Alternatively, the OS transistor may be separated from the single crystal silicon substrate by a hydrogen ion implantation separation method and fixed to a flexible substrate.

In this embodiment, a structure example of a semiconductor device in which an OS transistor is provided above a Si transistor formed in a single crystal silicon substrate will be described below.

<Structure Example of Semiconductor Device>

Figure 7:
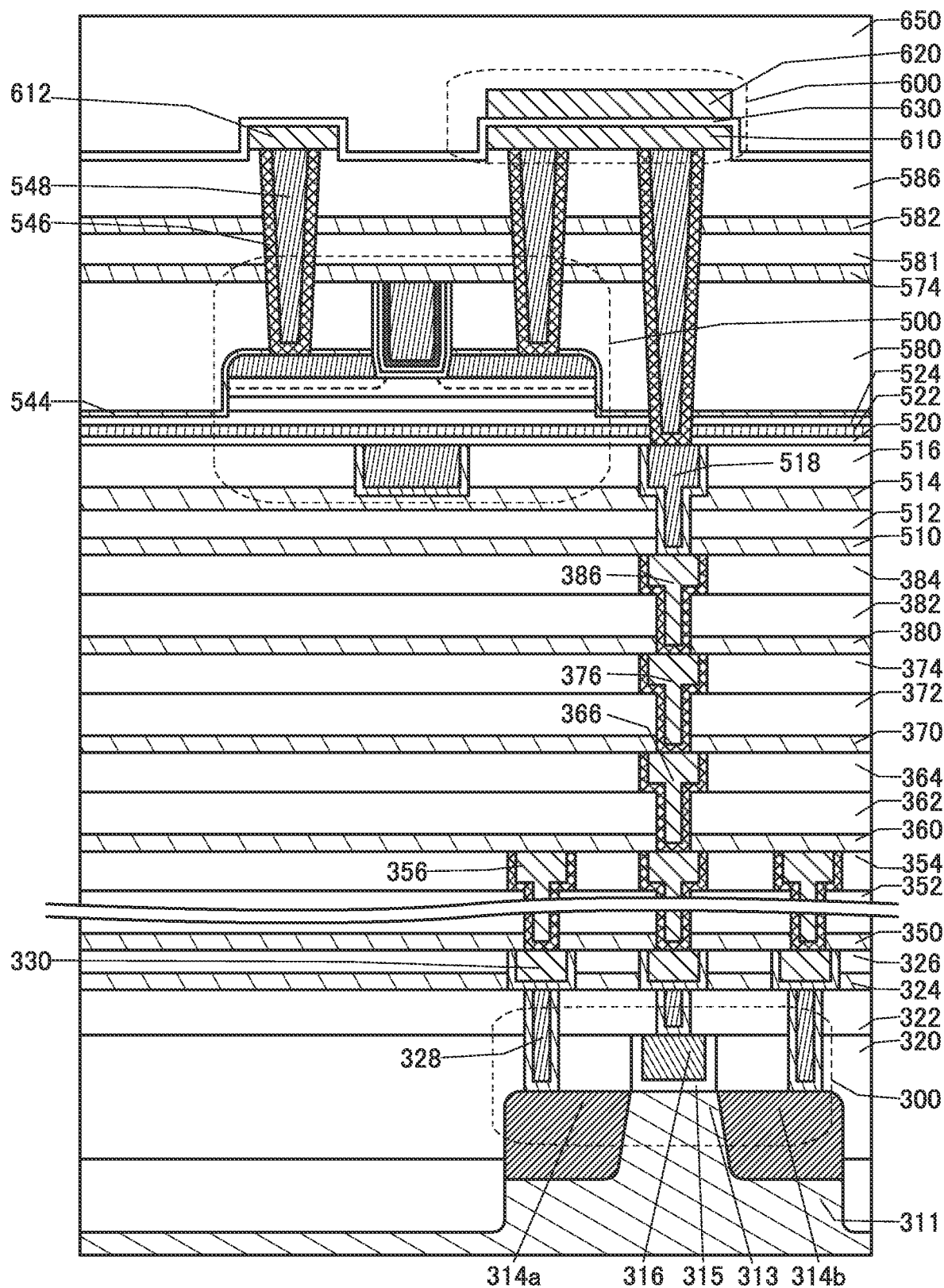
FIG. 7 is a cross-sectional view illustrating a structure example of a semiconductor device.
Figure 8A:
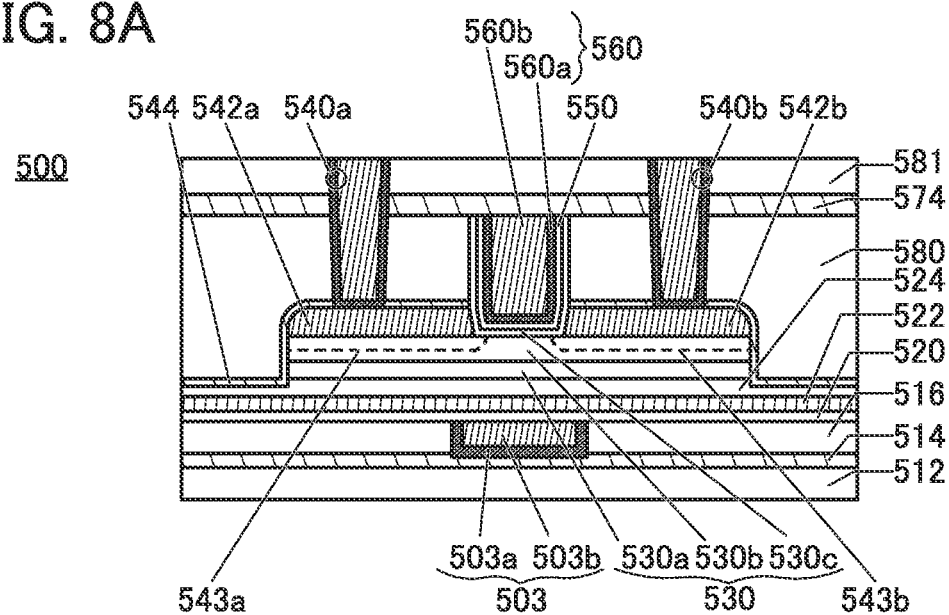
FIG. 8A, FIG. 8B, and FIG. 8C are cross-sectional views illustrating structure examples of transistors.
Figure 8B:
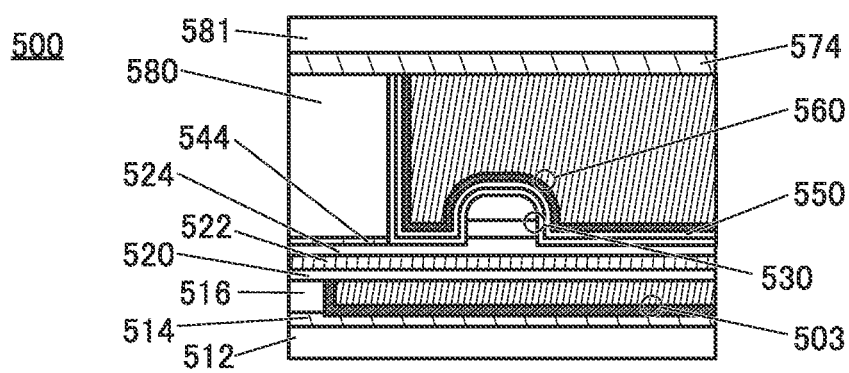
Figure 8C:
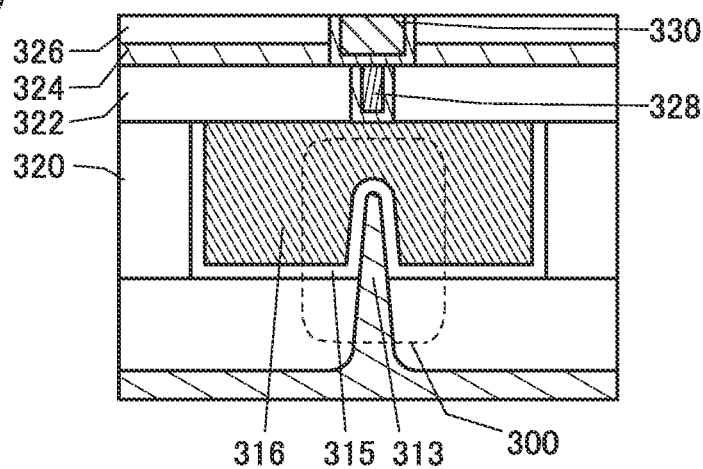

A semiconductor device illustrated in FIG. 7 includes a transistor 300, a transistor 500, and a capacitor 600. FIG. 8A is a cross-sectional view of the transistor 500 in the channel length direction, FIG. 8B is a cross-sectional view of the transistor 500 in the channel width direction, and FIG. 8C is a cross-sectional view of the transistor 300 in the channel width direction.

The transistor 500 is a transistor including a metal oxide in its channel formation region (an OS transistor). Features of the transistor 500 are such that a high voltage can be applied between a source and a drain, the off-state current does not easily increase even under a high-temperature environment, and the ratio between the on-state current and the off-state current is high even under a high-temperature environment. Thus, by using this for the charge control circuit 10 in the above embodiment, a mobile device can be a highly safe semiconductor device.

The semiconductor device described in this embodiment includes the transistor 300, the transistor 500, and the capacitor 600 as illustrated in FIG. 7. The transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 8C, in the transistor 300, a top surface and a side surface in the channel width direction of the semiconductor region 313 are covered with the conductor 316 with the insulator 315 therebetween. Such a Fin-type transistor 300 can have an increased effective channel width, and thus have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 illustrated in FIG. 7 is just an example and is not limited to having the structure shown therein; an appropriate transistor can be used in accordance with the circuit configuration or the driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for eliminating a level difference caused by the transistor 300 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into the region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for an interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 7, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 7, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 364 and the conductor 366. For example, in FIG. 7, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 374 and the conductor 376. For example, in FIG. 7, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by the barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents diffusion of hydrogen or impurities from the substrate 311, the region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low permittivity is used for the interlayer film, the parasitic capacitance between wirings can be reduced. Silicon oxide films, silicon oxynitride films, or the like can be used as the insulator 512 and the insulator 516, for example.

A conductor 518, a conductor included in the transistor 500 (a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 516.

As illustrated in FIG. 8A and FIG. 8B, the transistor 500 includes the conductor 503 positioned to be embedded in the insulator 512 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As illustrated in FIG. 8A and FIG. 8B, an insulator 544 is preferably positioned between the insulator 580 and the oxide 530a, the oxide 530b, the conductor 542a, and the conductor 542b. As illustrated in FIG. 8A and FIG. 8B, the conductor 560 preferably includes a conductor 560a provided on the inner side of the insulator 550 and a conductor 560b provided to be embedded on the inner side of the conductor 560a. Moreover, as illustrated in FIG. 8A and FIG. 8B, an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

The transistor 500 has a structure in which three layers of the oxide 530a, the oxide 530b, and the oxide 530c are stacked in the region where the channel is formed and its vicinity; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. The transistor 500 illustrated in FIG. 7, FIG. 8A, and FIG. 8B is just an example and is not limited to the structure shown therein; an appropriate transistor can be used in accordance with a circuit structure or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, Vth of the transistor 500 can be controlled by changing a potential applied to the conductor 503 independently of a potential applied to the conductor 560. In particular, Vth of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to be overlapped by the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

Furthermore, in this specification and the like, the S-channel structure has a feature in that the side surface and the vicinity of the oxide 530 in contact with the conductor 542a and the conductor 542b functioning as the source electrode and the drain electrode are of i-type like the channel formation region. The side surface and the vicinity of the oxide 530 in contact with the conductor 542a and the conductor 542b are in contact with the insulator 544 and thus can be of i-type like the channel formation region. Note that in this specification and the like, "i-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

The conductor 503 has a structure similar to that of the conductor 518; a conductor 503a is formed in contact with an inner wall of an opening in the insulator 514 and the insulator 516, and a conductor 503b is formed on the inner side.

The insulator 520, the insulator 522, the insulator 524, and the insulator 550 have a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

When the insulator 524 includes an excess-oxygen region, it is preferable that the insulator 522 have a function of inhibiting diffusion of oxygen (e.g., oxygen atoms and oxygen molecules) (or that the insulator 522 be less likely to transmit the above oxygen).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

For example, the insulator 522 is preferably formed using a single layer or stacked layers of an insulator containing what is called a high-k material, such as aluminum oxide, hafnium oxide, tantalum oxide, zirconium oxide, lead zirconate titanate (PZT), strontium titanate (SrTiO$_3$), or (Ba,Sr)TiO$_3$ (BST). With miniaturization and high integration of transistors, a problem such as leakage current may arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (i.e., an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator which is a high-k material is combined with silicon oxide or silicon oxynitride, the insulator 520 having a stacked-layer structure that has thermal stability and a high dielectric constant can be obtained.

Note that the insulator 520, the insulator 522, and the insulator 524 may each have a stacked-layer structure of two or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

Furthermore, a metal oxide with a low carrier density is preferably used in the transistor 500. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state.

Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect in which hydrogen has entered an oxygen vacancy can function as a donor of a metal oxide. However, it is difficult to evaluate the defects quantitatively. Thus, the metal oxide is sometimes evaluated by not its donor concentration but its carrier density. Therefore, in this specification and the like, as the parameter of the metal oxide, the carrier density assuming the state where an electric field is not applied is sometimes used instead of the donor concentration. That is, "carrier density" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide 530, the carrier density of the metal oxide in the channel formation region is preferably lower than or equal to $1\times10^{18}$ cm$^{-3}$, further preferably lower than $1\times10^{17}$ cm$^{-3}$, further preferably lower than $1\times10^{16}$ cm$^{-3}$, further preferably lower than $1\times10^{13}$ cm$^{-3}$, further preferably lower than $1\times10^{12}$ cm$^{-3}$. Note that the lower limit of the carrier density of the metal oxide in the channel formation region is not particularly limited and can be, for example, $1\times10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

The above layer is not necessarily formed between the conductor 542 and the oxide 530b, but the layer may be formed between the conductor 542 and the oxide 530c, or formed between the conductor 542 and the oxide 530b and between the conductor 542 and the oxide 530c.

The metal oxide functioning as the channel formation region in the oxide 530 has a bandgap of preferably 2 eV or higher, further preferably 2.5 eV or higher. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 8A, a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. Furthermore, the channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530c. The insulator 550 is preferably formed using an insulator from which oxygen is released by heating. For example, the insulator 550 is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. Note that the temperature of the film surface in the TDS analysis is preferably within the range of 100° C. to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Although the conductor 560 functioning as the first gate electrode has a two-layer structure in FIG. 8A and FIG. 8B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used.

Furthermore, the conductor 560b also functions as a wiring and thus is preferably a conductor having high conductivity. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably lowered.

The opening of the insulator 580 is formed to overlap the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Thus, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for the interlayer film, the parasitic capacitance between wirings can be reduced. A silicon oxide film, a silicon oxynitride film, or the like can be used for the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using a material similar to those for the conductor 328 and the conductor 330.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 are shown to have a single-layer structure in FIG. 7, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap the conductor 610 with the insulator 630 therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided. Alternatively, a semiconductor device using a transistor including an oxide semiconductor can be miniaturized or highly integrated.

<Transistor Structure Examples>

Note that the structure of the transistor 500 in the semiconductor device described in this embodiment is not limited to the above. Examples of structures that can be used for the transistor 500 will be described below.

Transistor Structure Example 1

Figure 9A:
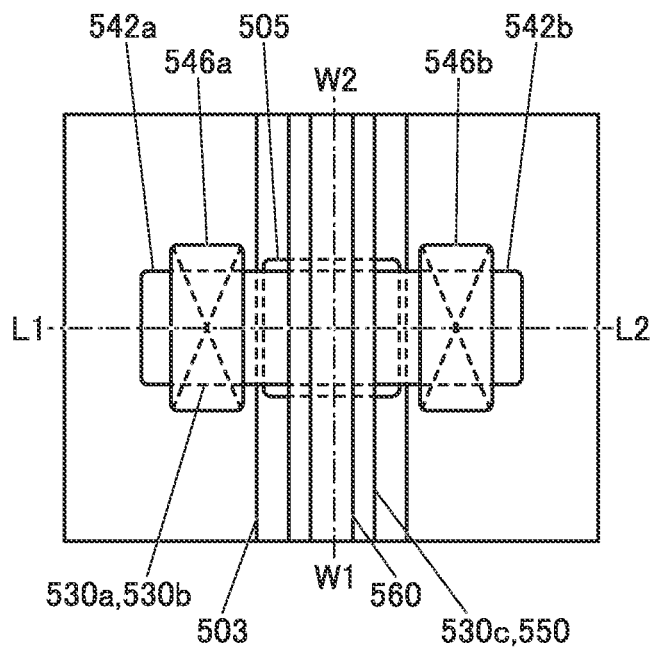
FIG. 9A is a top view illustrating a structure example of a transistor.
Figure 9C:
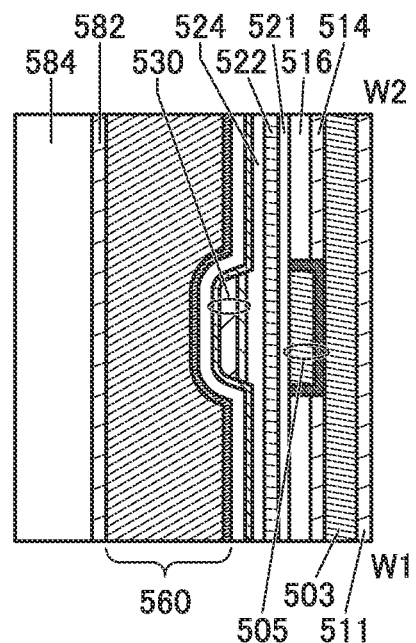
FIG. 9B and FIG. 9C are cross-sectional views illustrating the structure example of the transistor.
Figure 9B:
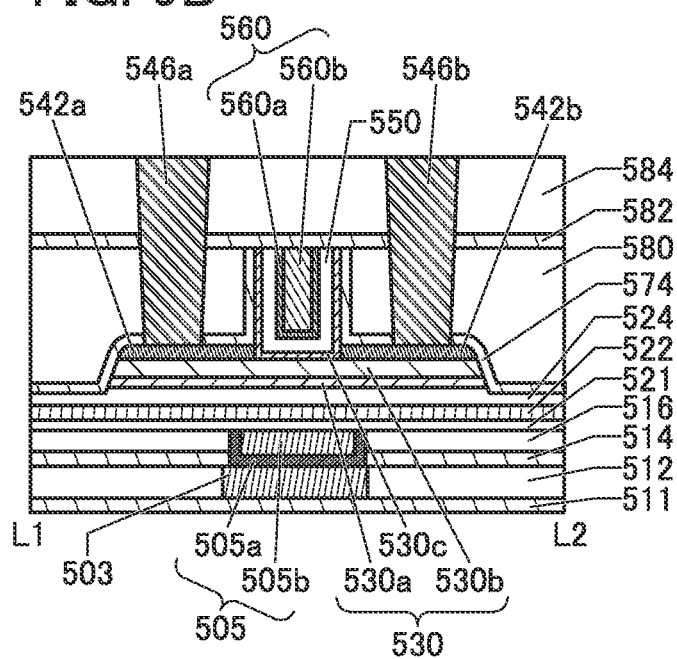

A structure example of a transistor 510A is described with reference to FIG. 9A, FIG. 9B, and FIG. 9C. FIG. 9A is a top view of the transistor 510A. FIG. 9B is a cross-sectional view of a portion indicated by the dashed-dotted line L1-L2 in FIG. 9A. FIG. 9C is a cross-sectional view of a portion indicated by the dashed-dotted line W1-W2 in FIG. 9A. Note that for clarification of the drawing, some components are not illustrated in the top view of FIG. 9A.

FIG. 9A, FIG. 9B, and FIG. 9C illustrate the transistor 510A and the insulator 511, the insulator 512, the insulator 514, the insulator 516, the insulator 580, the insulator 582, and an insulator 584 that function as interlayer films. In addition, the conductor 546 (a conductor 546a and a conductor 546b) that is electrically connected to the transistor 510A and functions as a contact plug, and the conductor 503 functioning as a wiring are illustrated.

The transistor 510A includes the conductor 560 (the conductor 560a and the conductor 560b) functioning as a first gate electrode; a conductor 505 (a conductor 505a and a conductor 505b) functioning as a second gate electrode; the insulator 550 functioning as a first gate insulating film; an insulator 521, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIG. 9, the oxide 530c, the insulator 550, and the conductor 560 are positioned in an opening portion provided in the insulator 580 with the insulator 574 positioned therebetween. Moreover, the oxide 530c, the insulator 550, and the conductor 560 are positioned between the conductor 542a and the conductor 542b.

The insulator 511 and the insulator 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities do not easily pass). Alternatively, it is preferable to use an insulating material that has a function of inhibiting diffusion of oxygen (e.g., at least one of an oxygen atom, an oxygen molecule, and the like) (through which the above oxygen does not easily pass). Moreover, aluminum oxide or silicon nitride, for example, may be used for the insulator 511. This structure can inhibit diffusion of impurities such as hydrogen and water to the transistor 510A side from the substrate side through the insulator 511.

For example, the permittivity of the insulator 512 is preferably lower than that of the insulator 511. When a material with a low permittivity is used for the interlayer film, the parasitic capacitance generated between wirings can be reduced.

The conductor 503 is formed to be embedded in the insulator 512. Here, the level of the top surface of the conductor 503 and the level of the top surface of the insulator 512 can be substantially the same. Note that although a structure in which the conductor 503 is a single layer is illustrated, the present invention is not limited thereto. For example, the conductor 503 may have a multilayer structure of two or more layers. Note that for the conductor 503, a conductive material that has high conductivity and contains tungsten, copper, or aluminum as its main component is preferably used.

In the transistor 510A, the conductor 560 sometimes functions as a first gate (also referred to as top gate) electrode. The conductor 505 sometimes functions as a second gate (also referred to as bottom gate) electrode. In that case, the threshold voltage of the transistor 510A can be controlled by changing a potential applied to the conductor 505 independently of a potential applied to the conductor 560. In particular, when a negative potential is applied to the conductor 505, the threshold voltage of the transistor 510A can be higher than 0 V, and the off-state current can be reduced. Thus, a drain current at the time when a potential applied to the conductor 560 is 0 V can be lower in the case where a negative potential is applied to the conductor 505 than in the case where a negative potential is not applied to the conductor 505.

For example, when the conductor 505 and the conductor 560 overlap each other, in the case where a potential is applied to the conductor 560 and the conductor 505, an electric field generated from the conductor 560 and an electric field generated from the conductor 505 are connected and can cover a channel formation region formed in the oxide 530.

That is, the channel formation region can be electrically surrounded by the electric field of the conductor 560 having a function of the first gate electrode and the electric field of the conductor 505 having a function of the second gate electrode. In other words, the transistor 510A has a surrounded channel (S-channel) structure, like the transistor 500 described above.

Like the insulator 511 or the insulator 512, the insulator 514 and the insulator 516 function as interlayer films. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side through the insulator 514. Moreover, for example, the insulator 516 preferably has a lower permittivity than the insulator 514. When a material with a low permittivity is used for the interlayer film, the parasitic capacitance generated between wirings can be reduced.

In the conductor 505 functioning as the second gate, the conductor 505a is formed in contact with an inner wall of an opening in the insulator 514 and the insulator 516, and the conductor 505b is formed further inside. Here, the top surfaces of the conductor 505a and the conductor 505b and the top surface of the insulator 516 can be substantially level with each other. Although the transistor 510A having a structure in which the conductor 505a and the conductor 505b are stacked is illustrated, the present invention is not limited thereto. For example, the conductor 505 may have a single-layer structure or a stacked-layer structure of three or more layers.

Here, for the conductor 505a, it is preferable to use a conductive material that has a function of inhibiting diffusion of impurities such as a hydrogen atom, a hydrogen molecule, a water molecule, and a copper atom (through which the above impurities are less likely to pass). Alternatively, it is preferable to use a conductive material that has a function of inhibiting diffusion of oxygen (e.g., at least one of an oxygen atom, an oxygen molecule, and the like) (through which the above oxygen is less likely to pass). Note that in this specification, a function of inhibiting diffusion of impurities or oxygen means a function of inhibiting diffusion of any one or all of the above impurities and the above oxygen.

For example, when the conductor 505a has a function of inhibiting diffusion of oxygen, a reduction in conductivity of the conductor 505b due to oxidation can be inhibited.

In the case where the conductor 505 doubles as a wiring, the conductor 505b is preferably formed using a conductive material that has high conductivity and contains tungsten, copper, or aluminum as its main component. In that case, the conductor 503 is not necessarily provided. Note that the conductor 505b is illustrated as a single layer but may have a stacked-layer structure, for example, a stacked-layer structure of any of the above conductive materials and titanium or titanium nitride.

The insulator 521, the insulator 522, and the insulator 524 function as a second gate insulating film.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing what is called a high-k material, such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST), are preferably used, for example. With miniaturization and high integration of transistors, a problem such as leakage current may arise because of a thinner gate insulating film. When a high-k material is used for the insulator functioning as the gate insulating film, a gate potential at the time when the transistor operates can be reduced while the physical thickness is maintained.

It is preferable that the insulator 521 be thermally stable. For example, silicon oxide and silicon oxynitride, which have thermal stability, are preferable. In addition, a combination of an insulator of a high-k material and silicon oxide or silicon oxynitride allows the insulator 521 to have a stacked-layer structure with thermal stability and a high dielectric constant.

Note that the second gate insulating film is shown to have a stacked-layer structure of three layers in FIG. 9, but may have a single-layer structure or a stacked-layer structure of two or more layers. In such cases, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one type of metal oxide, can be used.

Note that the oxide 530c is preferably provided in the opening portion in the insulator 580 with the insulator 574 positioned therebetween. When the insulator 574 has a barrier property, diffusion of impurities from the insulator 580 into the oxide 530 can be inhibited.

One of the conductors 542 functions as a source electrode and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and high oxidation resistance.

Although FIG. 9 illustrates the case where the conductor 542 has a single-layer structure, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

A barrier layer may be provided over the conductor 542. The barrier layer is preferably formed using a substance having a barrier property against oxygen or hydrogen. This structure can inhibit oxidation of the conductor 542 at the time of depositing the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening portion in the insulator 580 with the oxide 530c and the insulator 574 positioned therebetween.

With miniaturization and high integration of transistors, a problem such as leakage current may arise because of a thinner gate insulating film. In that case, the insulator 550 may have a stacked-layer structure like the second gate insulating film. When the insulator functioning as the gate insulating film has a stacked-layer structure of a high-k material and a thermally stable material, a gate potential at the time when the transistor operates can be reduced while the physical thickness is maintained. Furthermore, the stacked-layer structure can be thermally stable and have a high dielectric constant.

The conductor 560 functioning as the first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

As a conductive material having a function of inhibiting diffusion of oxygen, tantalum, tantalum nitride, ruthenium, or ruthenium oxide is preferably used, for example. For the conductor 560a, the oxide semiconductor that can be used as the oxide 530 can be used. In that case, when the conductor 560b is deposited by a sputtering method, the conductor 560a can have a reduced electric resistance to be a conductor. This can be referred to as an OC (Oxide Conductor) electrode.

The conductor 560b functions as a wiring and thus is preferably formed using a conductor having high conductivity. For example, a conductive material containing tungsten, copper, or aluminum as its main component can be used. The conductor 560b may have a stacked-layer structure, for example, a stacked-layer structure of titanium or titanium nitride and the above conductive material.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 function as interlayer films.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower permittivity than the insulator 582. When a material with a low permittivity is used for the interlayer film, the parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a conductive material such as a metal material, an alloy material, a metal nitride material, or a metal oxide material can be used as a single layer or stacked layers, as in the case of the conductor 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of the wiring is maintained.

With the above structure, a semiconductor device including a transistor that contains an oxide semiconductor and has a high on-state current can be provided. Alternatively, a semiconductor device using a transistor that contains an oxide semiconductor and has a low off-state current can be provided. Alternatively, a semiconductor device that has small variations in electrical characteristics, stable electrical characteristics, and high reliability can be provided.

Transistor Structure Example 2

A structure example of a transistor 510B is described with reference to FIG. 10A, FIG. 10B, and FIG. 10C. FIG. 10A is a top view of the transistor 510B. FIG. 10B is a cross-sectional view of a portion indicated by the dashed-dotted line L1-L2 in FIG. 10A. FIG. 10C is a cross-sectional view of a portion indicated by the dashed-dotted line W1-W2 in FIG. 10A. Note that for clarification of the drawing, some components are not illustrated in the top view of FIG. 10A.

The transistor 510B is a variation example of the transistor 510A. Therefore, differences from the transistor 510A will be mainly described to avoid repeated description.

The transistor 510B includes a region where the oxide 530c, the insulator 550, and the conductor 560 overlap the conductor 542 (the conductor 542a and the conductor 542b). With this structure, a transistor having a high on-state current can be provided. Moreover, a transistor having high controllability can be provided.

The conductor 560 functioning as a first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 574 is preferably provided to cover the top surface and a side surface of the conductor 560, a side surface of the insulator 550, and a side surface of the oxide 530c. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

Transistor Structure Example 3

Figure 11A:
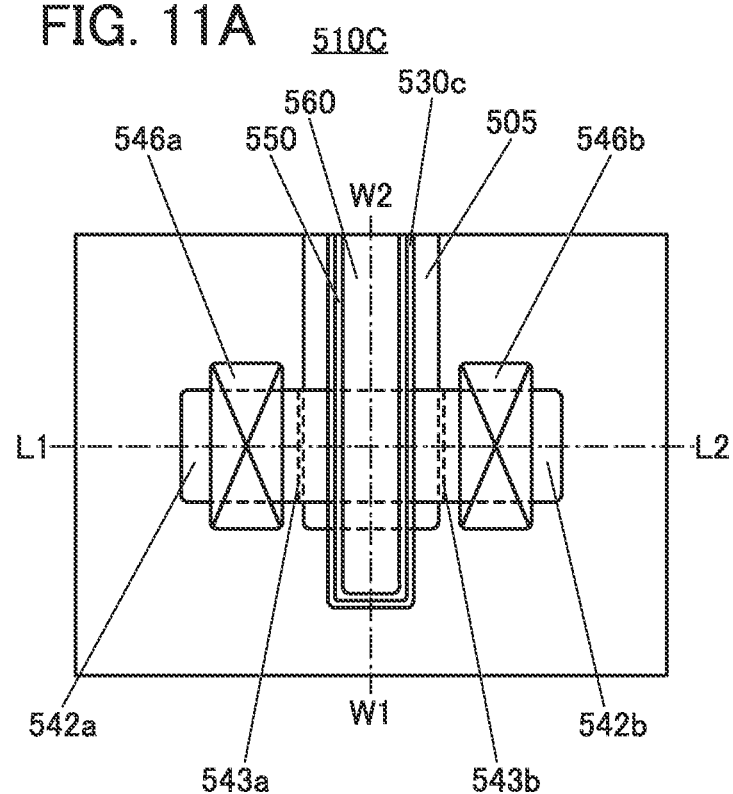
FIG. 11A is a top view illustrating a structure example of a transistor.
Figure 11C:
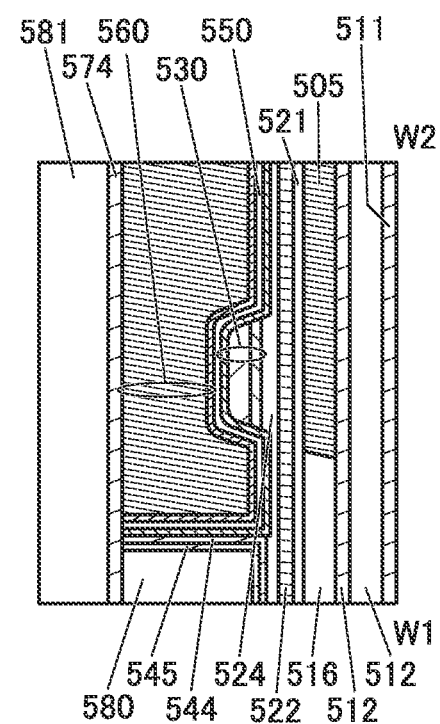
FIG. 11B and FIG. 11C are cross-sectional views illustrating the structure example of the transistor.
Figure 11B:
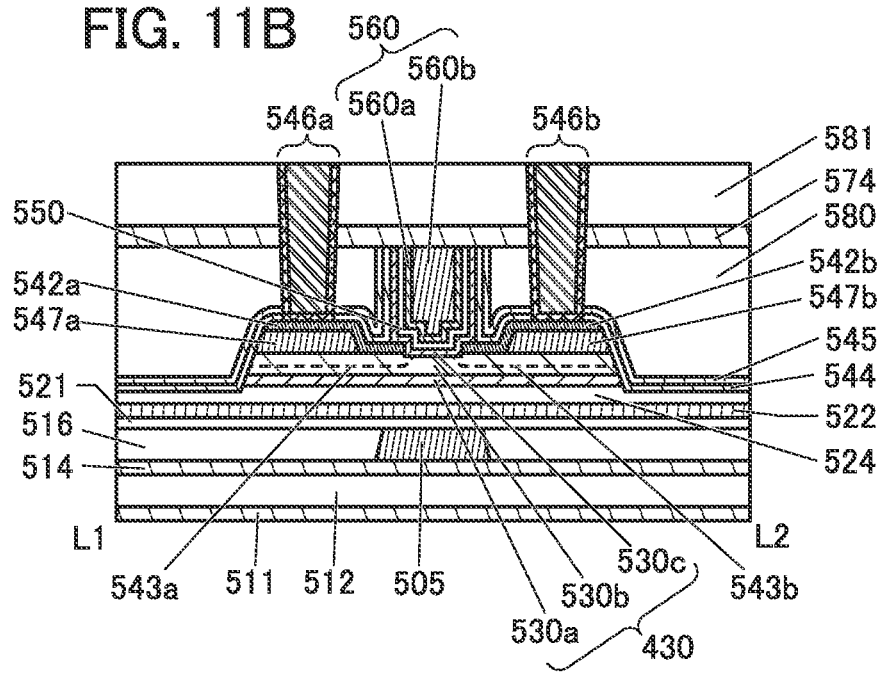

A structure example of a transistor 510C is described with reference to FIG. 11A, FIG. 11B, and FIG. 11C. FIG. 11A is a top view of the transistor 510C. FIG. 11B is a cross-sectional view of a portion along the dashed-dotted line L1-L2 in FIG. 11A. FIG. 11C is a cross-sectional view of a portion along the dashed-dotted line W1-W2 in FIG. 11A. Note that for clarity of the drawing, some components are not illustrated in the top view of FIG. 11A.

The transistor 510C is a variation example of the transistor 510A. Therefore, differences from the transistor 510A will be mainly described to avoid repeated description.

In the transistor 510C illustrated in FIG. 11, a conductor 547a is positioned between the conductor 542a and the oxide 530b, and a conductor 547b is positioned between the conductor 542b and the oxide 530b. Here, the conductor 542a (the conductor 542b) has a region that extends beyond the top surface of the conductor 547a (the conductor 547b) and its side surface on the conductor 560 side and is in contact with the top surface of the oxide 530b. For the conductors 547, a conductor that can be used for the conductor 542 is used. It is preferable that the thickness of the conductor 547 be at least greater than that of the conductor 542.

In the transistor 510C illustrated in FIG. 11, because of the above structure, the conductor 542 can be closer to the conductor 560 than in the transistor 510A. Alternatively, the conductor 560 can overlap an end portion of the conductor 542a and an end portion of the conductor 542b. Thus, the effective channel length of the transistor 510C can be shortened, and the on-state current and the frequency characteristics can be improved.

The conductor 547a (the conductor 547b) is preferably provided to be overlapped by the conductor 542a (the conductor 542b). With such a structure, the conductor 547a (the conductor 547b) can function as a stopper to prevent over-etching of the oxide 530b in etching for forming the opening in which the conductor 546a (the conductor 546b) is to be embedded.

The transistor 510C illustrated in FIG. 11 may have a structure in which an insulator 545 is positioned on and in contact with the insulator 544. The insulator 544 preferably functions as a barrier insulating film that inhibits entry of impurities such as water or hydrogen and excess oxygen into the transistor 510C from the insulator 580 side. The insulator 544 can be formed using an insulator that can be used for the insulator 545. In addition, the insulator 544 may be formed using a nitride insulator such as aluminum nitride, aluminum titanium nitride, titanium nitride, silicon nitride, or silicon nitride oxide, for example.

Unlike in the transistor 510A illustrated in FIG. 9, in the transistor 510C illustrated in FIG. 11, the conductor 505 may be provided to have a single-layer structure. In this case, an insulating film to be the insulator 516 is formed over the patterned conductor 505, and an upper portion of the insulating film is removed by a CMP method or the like until the top surface of the conductor 505 is exposed. Preferably, the planarity of the top surface of the conductor 505 is made favorable. For example, the average surface roughness (Ra) of the top surface of the conductor 505 is less than or equal to 1 nm, preferably less than or equal to 0.5 nm, further preferably less than or equal to 0.3 nm. This allows the improvement in planarity of an insulating layer formed over the conductor 505 and the increase in crystallinity of the oxide 530b and the oxide 530c.

Transistor Structure Example 4

Figure 12A:
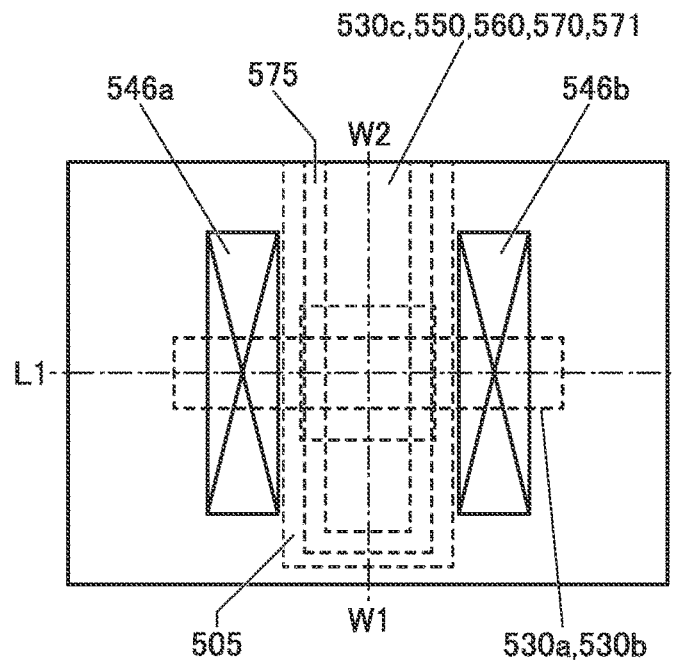
FIG. 12A is a top view illustrating a structure example of a transistor.
Figure 12C:
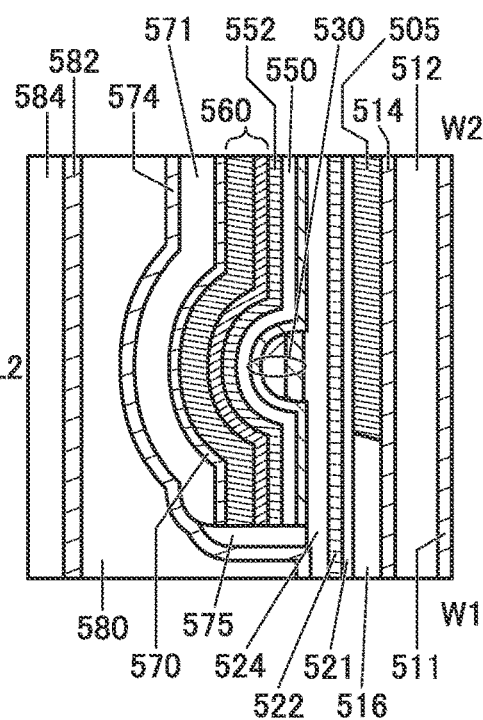
FIG. 12B and FIG. 12C are cross-sectional views illustrating the structure example of the transistor.
Figure 12B:
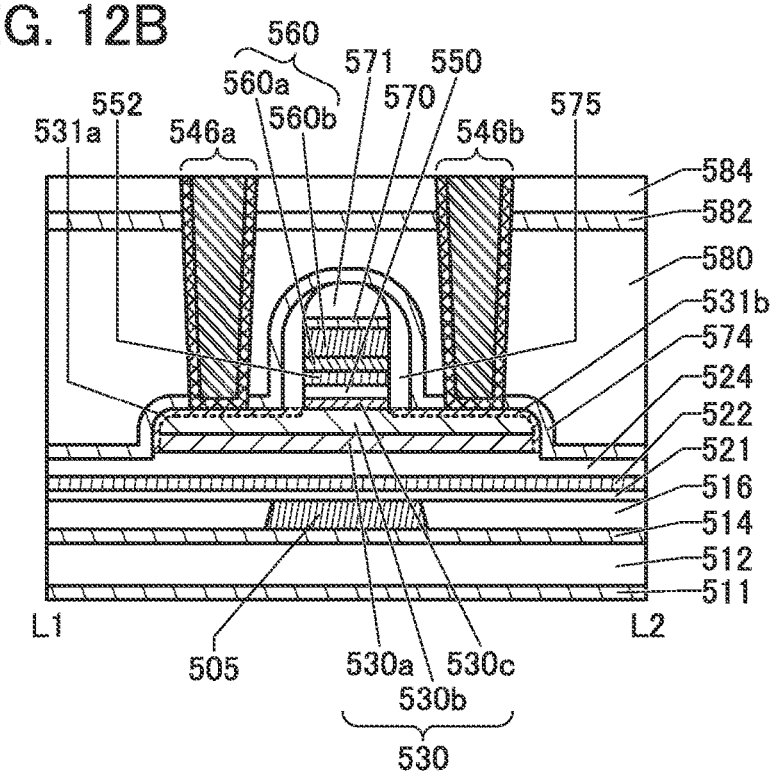

A structure example of a transistor 510D is described with reference to FIG. 12A, FIG. 12B, and FIG. 12C. FIG. 12A is a top view of the transistor 510D. FIG. 12B is a cross-sectional view of a portion along the dashed-dotted line L1-L2 in FIG. 12A. FIG. 12C is a cross-sectional view of a portion along the dashed-dotted line W1-W2 in FIG. 12A. Note that for simplification of the drawing, some components are not illustrated in the top view of FIG. 12A.

The transistor 510D is a variation example of the above transistors. Therefore, differences from the above transistors will be mainly described to avoid repeated description.

In FIG. 12A to FIG. 12C, the conductor 503 is not provided, and the conductor 505 that has a function of a second gate is made to function also as a wiring. The transistor 500D includes the insulator 550 over the oxide 530c and a metal oxide 552 over the insulator 550. The conductor 560 is provided over the metal oxide 552, and an insulator 570 is provided over the conductor 560. An insulator 571 is provided over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidation of the conductor 560 due to oxygen can be inhibited.

Note that the metal oxide 552 may have a function of part of the first gate. For example, the oxide semiconductor that can be used for the oxide 530 can be used for the metal oxide 552. In that case, when the conductor 560 is deposited by a sputtering method, the electric resistance of the metal oxide 552 is lowered so that the metal oxide 552 can become a conductive layer (the above-described OC electrode).

The metal oxide 552 may have a function of part of a gate insulating film. Thus, when silicon oxide, silicon oxynitride, or the like is used for the insulator 550, a metal oxide that is a high-k material with a high dielectric constant is preferably used for the metal oxide 552. Such a stacked-layer structure can be thermally stable and can have a high dielectric constant. Thus, a gate potential that is applied when the transistor operates can be lowered while the physical thickness is maintained. In addition, the equivalent oxide thickness (EOT) of an insulating layer functioning as the gate insulating film can be reduced.

Although the metal oxide 552 in the transistor 510D is shown as a single layer, the metal oxide 552 may have a stacked-layer structure of two or more layers. For example, a metal oxide functioning as part of the gate electrode and a metal oxide functioning as part of the gate insulating film may be stacked.

With the metal oxide 552 functioning as a gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulator containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide 552 is not an essential component. Design is appropriately set in consideration of required transistor characteristics.

For the insulator 570, an insulating material having a function of inhibiting the passage of oxygen and impurities such as water and hydrogen is preferably used. For example, aluminum oxide or hafnium oxide is preferably used. Thus, oxidation of the conductor 560 due to oxygen from above the insulator 570 can be inhibited. Moreover, entry of impurities such as water or hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a substrate surface can be greater than or equal to 75° and less than or equal to 100°, preferably greater than or equal to 80° and less than or equal to 95°.

An insulating material having a function of inhibiting the passage of oxygen and impurities such as water or hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530c are selected and removed using the insulator 571 as a hard mask, whereby their side surfaces can be substantially aligned with each other and a surface of the oxide 530b can be partly exposed.

The transistor 510D includes a region 531a and a region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to as "impurity regions" or "low-resistance regions".

The region 531a and the region 531b can be formed in a self-aligned manner by using the insulator 571 and/or the conductor 560 as a mask. Thus, the conductor 560 does not overlap the region 531a and/or the region 531b, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and the impurity element is not added. The offset region can be formed by the addition of the impurity element after the formation of an insulator 575. In this case, the insulator 575 serves as a mask like the insulator 571 or the like. Thus, the impurity element is not added to a region of the oxide 530b overlapped by the insulator 575, so that the electrical resistivity of the region can be kept high.

The transistor 510D includes the insulator 575 on the side surfaces of the insulator 570, the conductor 560, the metal oxide 552, the insulator 550, and the oxide 530c. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water or hydrogen can be deposited. For example, aluminum oxide is preferably used for the insulator 574.

Note that an oxide film obtained by a sputtering method may extract hydrogen from the component over which the oxide film is deposited. Thus, the hydrogen concentration in the oxide 530 and the insulator 575 can be reduced when the insulator 574 absorbs hydrogen and water from the oxide 530 and the insulator 575.

Transistor Structure Example 5

Figure 13A:
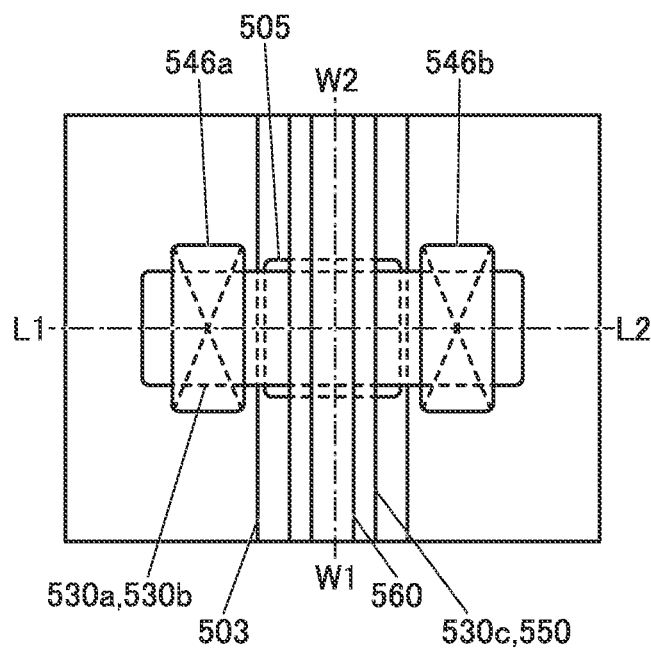
FIG. 13A is a top view illustrating a structure example of a transistor.
Figure 13C:
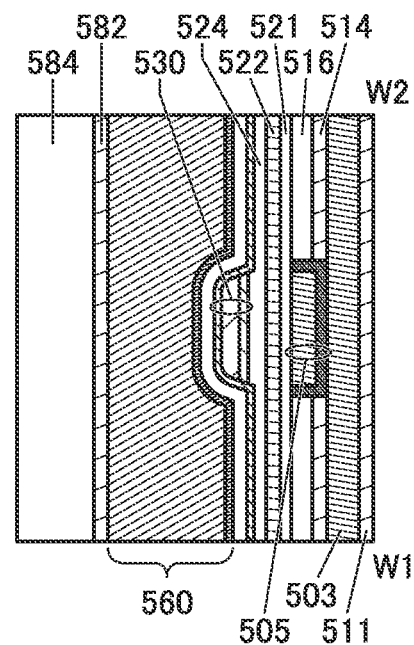
FIG. 13B and FIG. 13C are cross-sectional views illustrating the structure example of the transistor.
Figure 13B:
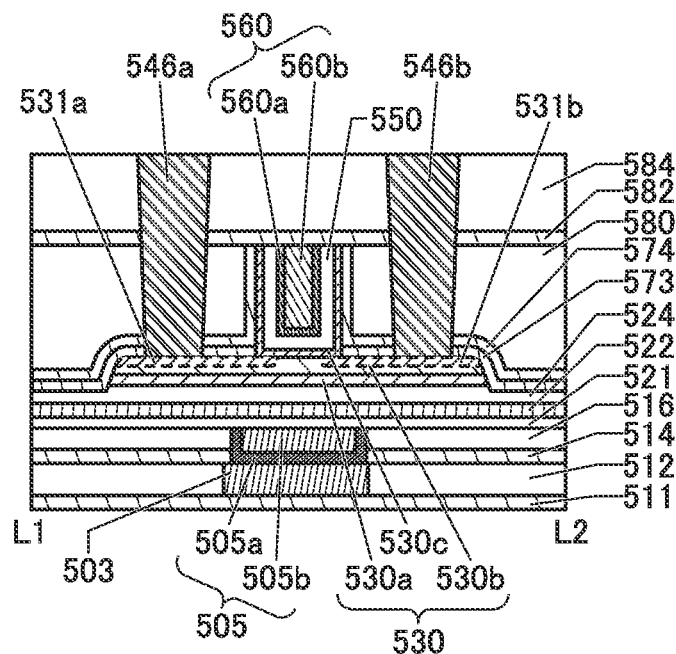

A structure example of a transistor 510E is described with reference to FIG. 13A to FIG. 13C. FIG. 13A is a top view of the transistor 510E. FIG. 13B is a cross-sectional view of a portion indicated by the dashed-dotted line L1-L2 in FIG. 13A. FIG. 13C is a cross-sectional view of a portion indicated by the dashed-dotted line W1-W2 in FIG. 13A. Note that for clarification of the drawing, some components are not illustrated in the top view of FIG. 13A.

The transistor 510E is a variation example of the above transistors. Therefore, differences from the above transistors will be mainly described to avoid repeated description.

In FIG. 13A to FIG. 13C, the conductor 542 is not provided, and part of the exposed surface of the oxide 530b includes the region 531a and the region 531b. One of the region 531a and the region 531b functions as a source region, and the other functions as a drain region. Moreover, an insulator 573 is included between the oxide 530b and the insulator 574.

Regions 531 (the region 531a and the region 531b) illustrated in FIG. 13 are regions where an element described below is added to the oxide 530b. The regions 531 can be formed with the use of a dummy gate, for example.

Specifically, a dummy gate is provided over the oxide 530b, and the element that reduces the resistance of the oxide 530b is added using the dummy gate as a mask. That is, the element is added to regions of the oxide 530 that are not overlapped by the dummy gate, whereby the regions 531 are formed. For the addition of the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas, or the like may be used. Typical examples of the rare gas include helium, neon, argon, krypton, and xenon. The concentration of the element is measured by secondary ion mass spectrometry (SIMS) or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulator 573 and an insulating film to be the insulator 574 may be formed over the oxide 530b and the dummy gate. Stacking the insulating film to be the insulator 573 and the insulating film to be the insulator 574 can provide a region where the oxide 530c and the insulator 550 overlap the region 531.

Specifically, after an insulating film to be the insulator 580 is provided over the insulating film to be the insulator 574, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at a side surface of an opening portion provided in the insulator 580, and the region 531 provided in the oxide 530b is partly exposed at the bottom surface of the opening portion. Next, an oxide film to be the oxide 530c, an insulating film to be the insulator 550, and a conductive film to be the conductor 560 are formed in this order in the opening portion, and then the oxide film to be the oxide 530c, the insulating film to be the insulator 550, and the conductive film to be the conductor 560 are partly removed by CMP treatment or the like until the insulator 580 is exposed; thus, the transistor illustrated in FIG. 13 can be formed.

Note that the insulator 573 and the insulator 574 are not essential components. Design is appropriately set in consideration of required transistor characteristics.

The cost of the transistor illustrated in FIG. 13 can be reduced because an existing apparatus can be used and the conductor 542 is not provided.

Transistor Structure Example 6

Figure 14A:
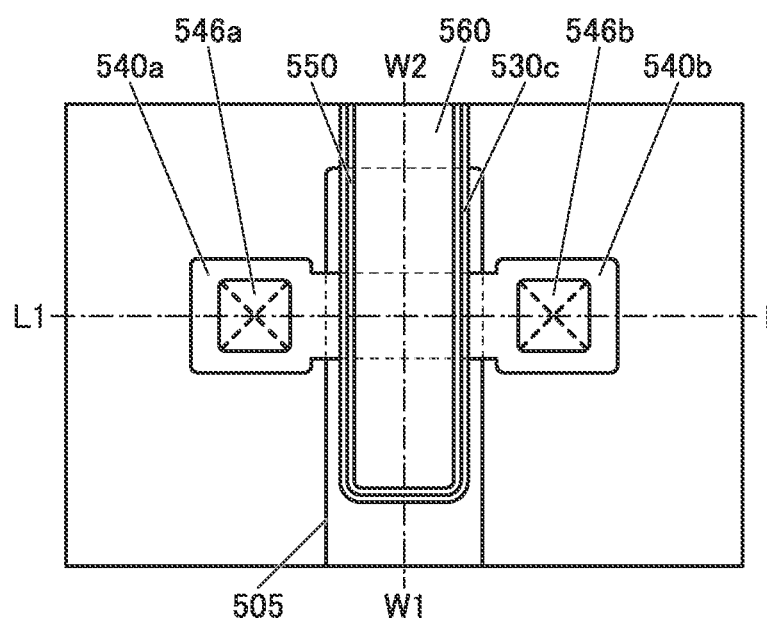
FIG. 14A is a top view illustrating a structure example of a transistor.
Figure 14C:
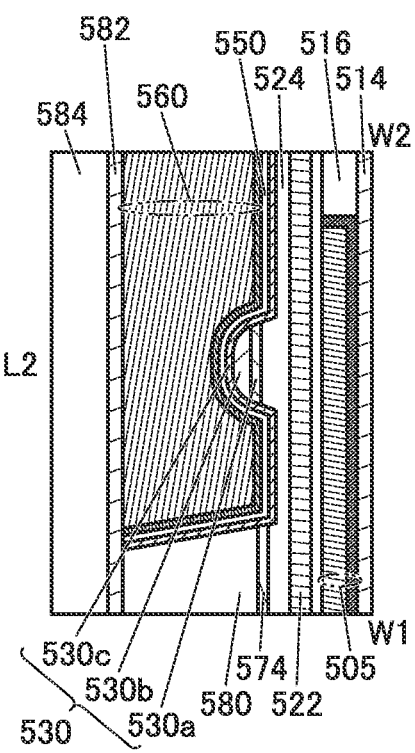
FIG. 14B and FIG. 14C are cross-sectional views illustrating the structure example of the transistor.
Figure 14B:
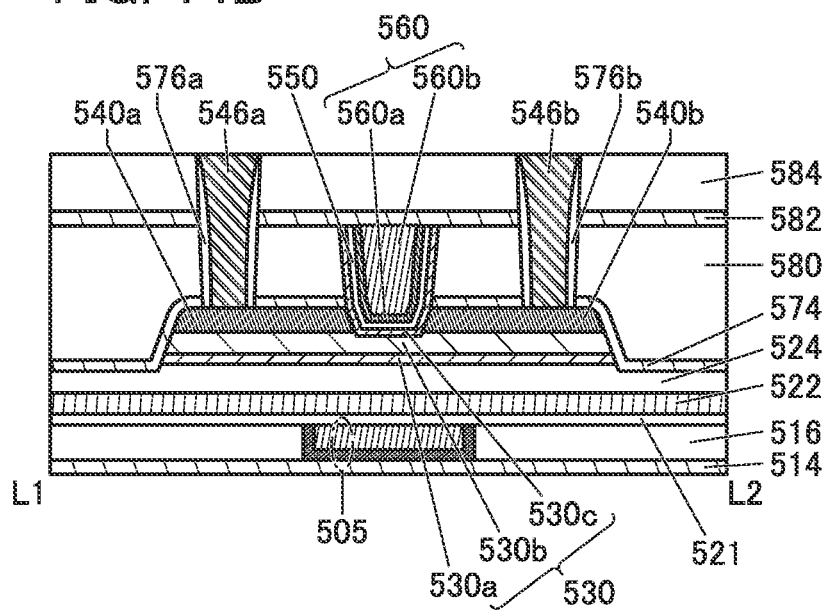

A structure example of a transistor 510F is described with reference to FIG. 14A to FIG. 14C. FIG. 14A is a top view of the transistor 510F. FIG. 14B is a cross-sectional view of a portion indicated by the dashed-dotted line L1-L2 in FIG. 14A. FIG. 14C is a cross-sectional view of a portion indicated by the dashed-dotted line W1-W2 in FIG. 14A. Note that for clarity of the drawing, some components are not illustrated in the top view of FIG. 14A.

The transistor 510F is a variation example of the transistor 510A. Therefore, differences from the above transistor will be mainly described to avoid repeated description.

In the transistor 510A, part of the insulator 574 is provided in the opening portion provided in the insulator 580 and covers the side surface of the conductor 560. Meanwhile, in the transistor 510F, an opening is formed by partly removing the insulator 580 and the insulator 574.

The insulator 576 (the insulator 576a and the insulator 576b) having a barrier property may be provided between the conductor 546 and the insulator 580. Providing the insulator 576 can prevent oxygen in the insulator 580 from reacting with the conductor 546 and oxidizing the conductor 546.

Note that when an oxide semiconductor is used as the oxide 530, the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably greater than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The oxide 530a, the oxide 530b, and the oxide 530c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 510F is stable against high temperatures in the manufacturing process (what is called thermal budget).

Note that one or both of the oxide 530a and the oxide 530c may be omitted. The oxide 530 may be a single layer of the oxide 530b. In the case where the oxide 530 is a stack of the oxide 530a, the oxide 530b, and the oxide 530c, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b. In that case, for the oxide 530c, a metal oxide that can be used for the oxide 530a is preferably used. Specifically, the atomic proportion of the element M in the constituent elements in the metal oxide used as the oxide 530c is preferably greater than the atomic proportion of the element M in the constituent elements in the metal oxide used as the oxide 530b. Moreover, the atomic ratio of the element M to In in the metal oxide used as the oxide 530c is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530c.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like may be used as the oxide 530a and the oxide 530c. In addition, the oxide 530c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, the oxide 530c may employ a stacked-layer structure of an In—Ga—Zn oxide and an oxide that does not contain In.

Specifically, as the oxide 530a, a metal oxide having In:Ga:Zn=1:3:4 [atomic ratio] or 1:1:0.5 [atomic ratio] is used. As the oxide 530b, a metal oxide having In:Ga:Zn=4:2:3 [atomic ratio] or 3:1:2 [atomic ratio] is used. As the oxide 530c, a metal oxide having In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Furthermore, specific examples of the case where the oxide 530c has a stacked-layer structure include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 510F can have a high on-state current and high frequency characteristics. Note that in the case where the oxide 530c has a stacked-layer structure, in addition to the effect of reducing the density of defect states at the interface between the oxide 530b and the oxide 530c, the effect of inhibiting diffusion of the constituent element of the oxide 530c to the insulator 550 side is expected. More specifically, the oxide 530c has a stacked-layer structure and the oxide that does not contain In is positioned at the upper part of the stacked-layer structure, whereby the amount of In that would diffuse to the insulator 550 side can be reduced. Since the insulator 550 functions as a gate insulator, the transistor has defects in characteristics when In diffuses. Thus, when the oxide 530c has a stacked-layer structure, a highly reliable display device can be provided.

A metal oxide functioning as an oxide semiconductor is preferably used as the oxide 530. For example, as the metal oxide to be the channel formation region in the oxide 530, a metal oxide having a bandgap of 2 eV or more, preferably 2.5 eV or more is preferably used. With the use of a metal oxide having such a wide bandgap, the off-state current of the transistor can be reduced. With the use of such a transistor, a semiconductor device with low power consumption can be provided.

Transistor Structure Example 7

Although FIG. 7 and FIG. 8 illustrate the structure example in which the conductor 560 having a function of a gate is formed in the opening of the insulator 580, a structure in which the insulator is provided above the conductor can be employed, for example. A structure example of such a transistor is illustrated in FIG. 15 and FIG. 16.

Figure 15A:
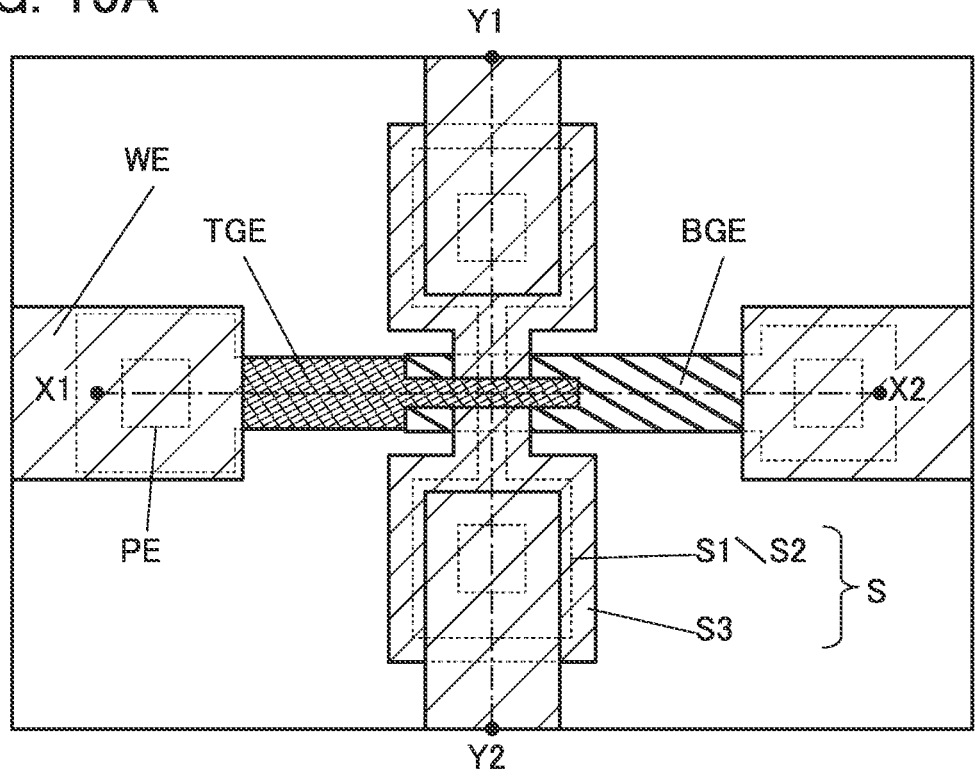
FIG. 15A is a top view illustrating a structure example of a transistor.
Figure 15B:
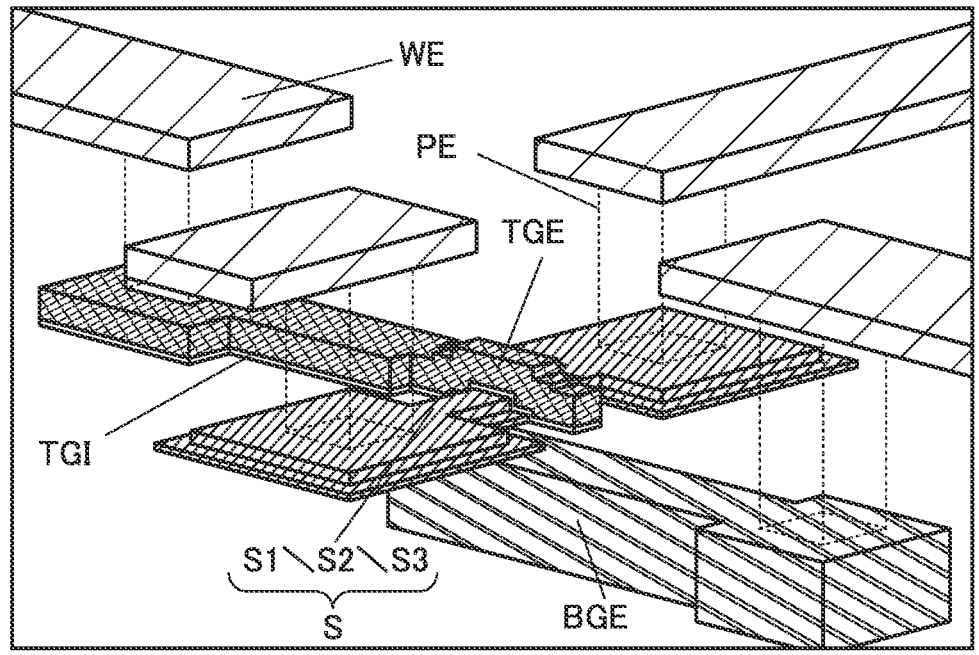
FIG. 15B is a perspective view illustrating the structure example of the transistor.
Figure 16A:
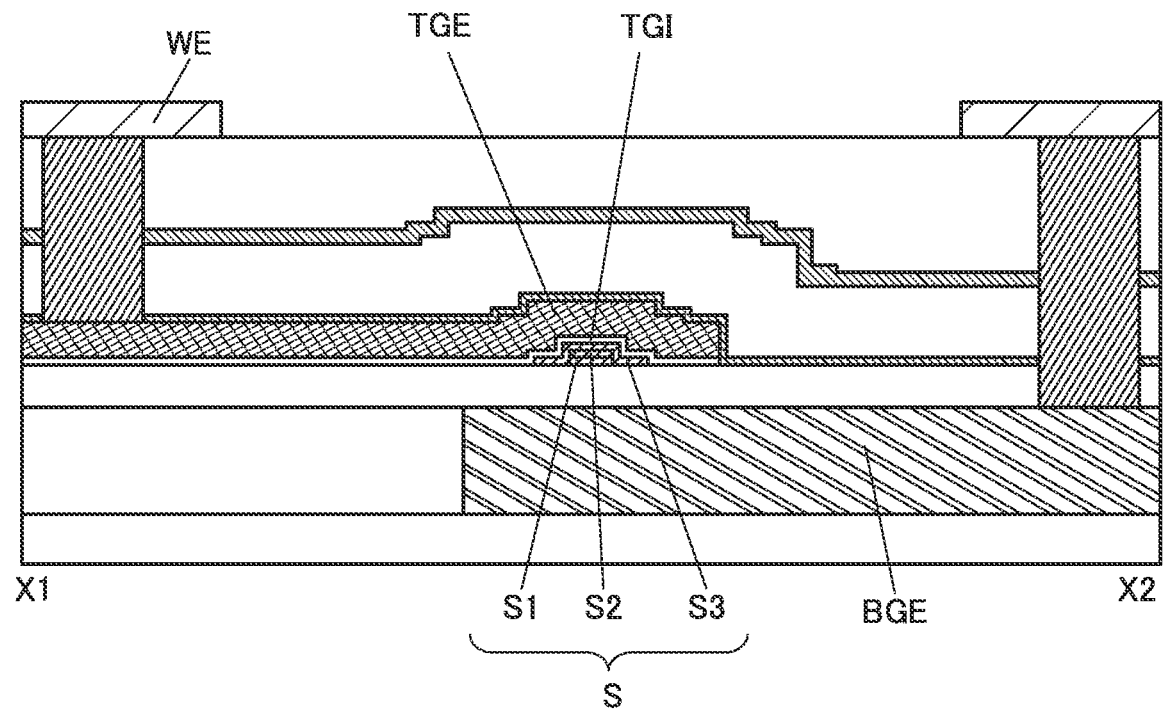
FIG. 16A and FIG. 16B are cross-sectional views illustrating a structure example of a transistor.
Figure 16B:
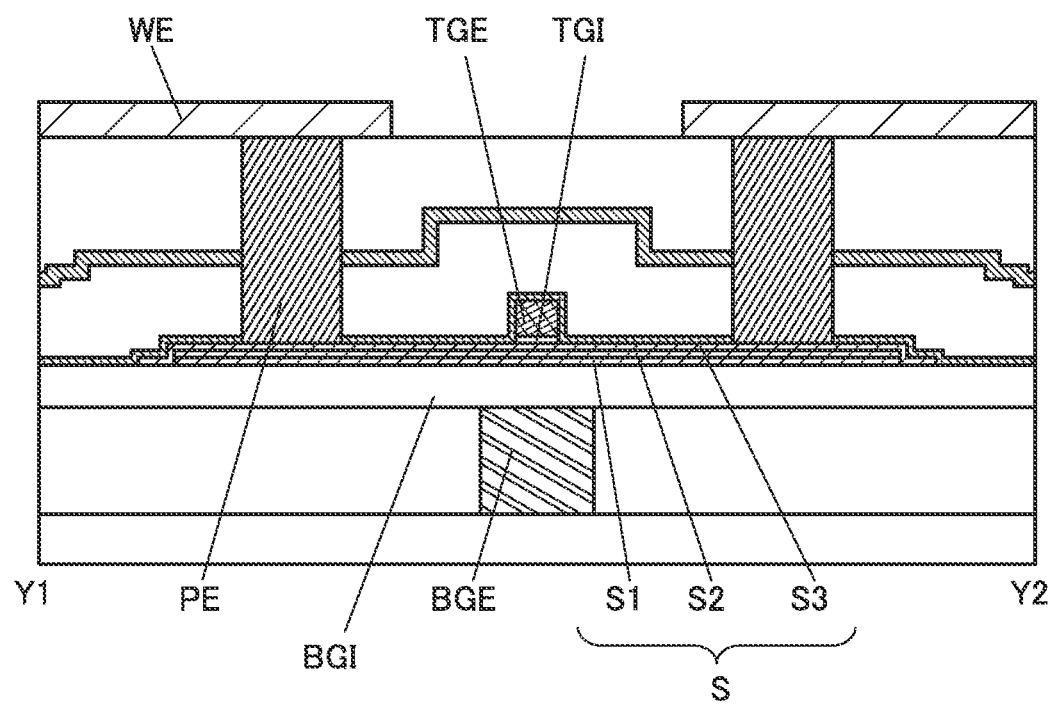

FIG. 15A is a top view of a transistor, and FIG. 15B is a perspective view of the transistor. FIG. 16A is a cross-sectional view along X1-X2 in FIG. 15A, and FIG. 16B is a cross-sectional view along Y1-Y2.

The transistor illustrated in FIG. 15 and FIG. 16 includes a conductor BGE having a function of a back gate, an insulator BGI having a function of a gate insulating film, an oxide semiconductor S, an insulator TGI having a function of a gate insulating film, a conductor TGE having a function of a front gate, and a conductor WE having a function of a wiring. A conductor PE has a function of a plug for connecting the conductor WE to the oxide S, the conductor BGE, or the conductor TGE. Note that an example in which the oxide semiconductor S includes three layers of oxides S1, S2, and S3 is shown here.

Embodiment 4

In this embodiment, the composition of a metal oxide that can be used in the OS transistor described in the above embodiment will be described.

<Composition of Metal Oxide>

In this specification and the like, CAAC (c-axis aligned crystal) and CAC (Cloud-Aligned Composite) may be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors are classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

As an oxide semiconductor used for a semiconductor of a transistor, a thin film having high crystallinity is preferably used. With the use of the thin film, the stability or reliability of the transistor can be improved. Examples of the thin film include a thin film of a single crystal oxide semiconductor and a thin film of a polycrystalline oxide semiconductor. However, to form the thin film of a single crystal oxide semiconductor or the thin film of a polycrystalline oxide semiconductor over a substrate, a high-temperature process or a laser heating process is needed. Thus, manufacturing cost is increased, and throughput is decreased.

Non-Patent Document 1 and Non-Patent Document 2 have reported that an In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has a periodic atomic arrangement in a microscopic region (e.g., a region with a size greater than or equal to 1 nm and less than or equal to 3 nm) and there is no regularity of crystal orientation between different regions.

Non-Patent Document 4 and Non-Patent Document 5 have shown changes in average crystal size due to electron beam irradiation to thin films of the above CAAC-IGZO, the above nc-IGZO, and IGZO having low crystallinity. In the thin film of IGZO having low crystallinity, crystalline IGZO with a crystal size of approximately 1 nm was observed even before electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Consequently, the thin film of CAAC-IGZO or the thin film of nc-IGZO is preferably used as the semiconductor of the transistor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited due to the distortion of lattice arrangement. This is probably because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor having high crystallinity. Meanwhile, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable against high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor has various structures with different properties. An oxide semiconductor of one embodiment of the present invention may include two or more of an amorphous oxide semiconductor, a polycrystalline oxide semiconductor, the a-like OS, the nc-OS, and the CAAC-OS.

<Transistor Including Oxide Semiconductor>

Next, the case where the above oxide semiconductor is used in a transistor will be described.

When the above oxide semiconductor is used in a transistor, a transistor having high field-effect mobility can be achieved. In addition, a transistor having high reliability can be achieved.

Non-Patent Document 6 shows that the transistor using the above oxide semiconductor has an extremely low leakage current in a non-conduction state, and specifically, the off-state current per micrometer in the channel width of the transistor is on the order of yA/μm ($10^{-24}$ A/μm). For example, a low-power-consumption CPU utilizing a characteristic of a low leakage current of the transistor using an oxide semiconductor is disclosed (see Non-Patent Document 7).

Furthermore, application of a transistor using an oxide semiconductor to a display device that utilizes the characteristic of a low leakage current of the transistor has been reported (see Non-Patent Document 8). In the display device, a displayed image is changed several tens of times per second. The number of times images are changed in one second is referred to as a refresh rate. The refresh rate is also referred to as drive frequency. Such high-speed screen change that is hard for human eyes to recognize is considered as a cause of eyestrain. Accordingly, reducing the number of times of image rewriting by lowering the refresh rate of the display device is proposed. Moreover, driving with a lowered refresh rate can reduce the power consumption of the display device. Such a driving method is referred to as idling stop (IDS) driving.

Furthermore, an oxide semiconductor having a low carrier density is preferably used in a transistor. To reduce the carrier density of an oxide semiconductor film, the impurity concentration in the oxide semiconductor film is lowered so that the density of defect states can be reduced. In this specification and the like, a state with a low impurity concentration and a low density of defect states is referred to as a highly purified intrinsic or substantially highly purified intrinsic state.

Moreover, a highly purified intrinsic or substantially highly purified intrinsic oxide semiconductor film has a low density of defect states and accordingly may have a low density of trap states.

Charges trapped by the trap states in an oxide semiconductor take a long time to be released and may behave like fixed charges. Thus, a transistor whose channel formation region is formed in an oxide semiconductor having a high density of trap states has unstable electrical characteristics in some cases.

Accordingly, in order to obtain stable electrical characteristics of a transistor, reducing the concentration in an oxide semiconductor is effective. In addition, in order to reduce the impurity concentration in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Therefore, it is preferable to reduce the concentration of an alkali metal or an alkaline earth metal in the oxide semiconductor. Specifically, the concentration of an alkali metal or an alkaline earth metal in the oxide semiconductor obtained by SIMS is lower than or equal to $1\times10^{18}$ atoms/cm$^3$, preferably lower than or equal to $2\times10^{16}$ atoms/cm$^3$.

When containing nitrogen, the oxide semiconductor easily becomes n-type by generation of electrons serving as carriers and an increase in carrier density. Thus, a transistor using an oxide semiconductor that contains nitrogen as a semiconductor is likely to have normally-on characteristics. For this reason, nitrogen in the oxide semiconductor is preferably reduced as much as possible. For example, the nitrogen concentration in the oxide semiconductor is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. For this reason, hydrogen in the oxide semiconductor is preferably reduced as much as possible. Specifically, the hydrogen concentration in the oxide semiconductor obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region of a transistor, stable electrical characteristics can be given.

The discovery of the CAAC structure and the nc structure has contributed to an improvement in electrical characteristics and reliability of a transistor using an oxide semiconductor having the CAAC structure or the nc structure, a reduction in manufacturing cost, and an improvement in throughput. Furthermore, applications of the transistor to a display device and an LSI utilizing the characteristics of low leakage current of the transistor have been studied.

Note that this embodiment can be implemented in combination with the other embodiments described in this specification as appropriate.

Embodiment 5

An example of providing a charge control circuit over a flexible substrate is described in the above-described embodiment; however, without particular limitation, a protection circuit, a second switch, a secondary coil, a sensor, or the like may be provided over the same substrate. The charge control circuit is formed over a flexible substrate, is bendable, and can detect abnormality such as a micro-short circuit of a secondary battery. Moreover, the charge control circuit of one embodiment of the present invention can be provided on a side surface of a secondary battery, and space saving and a reduction in the number of components can be achieved.

Figure 17:
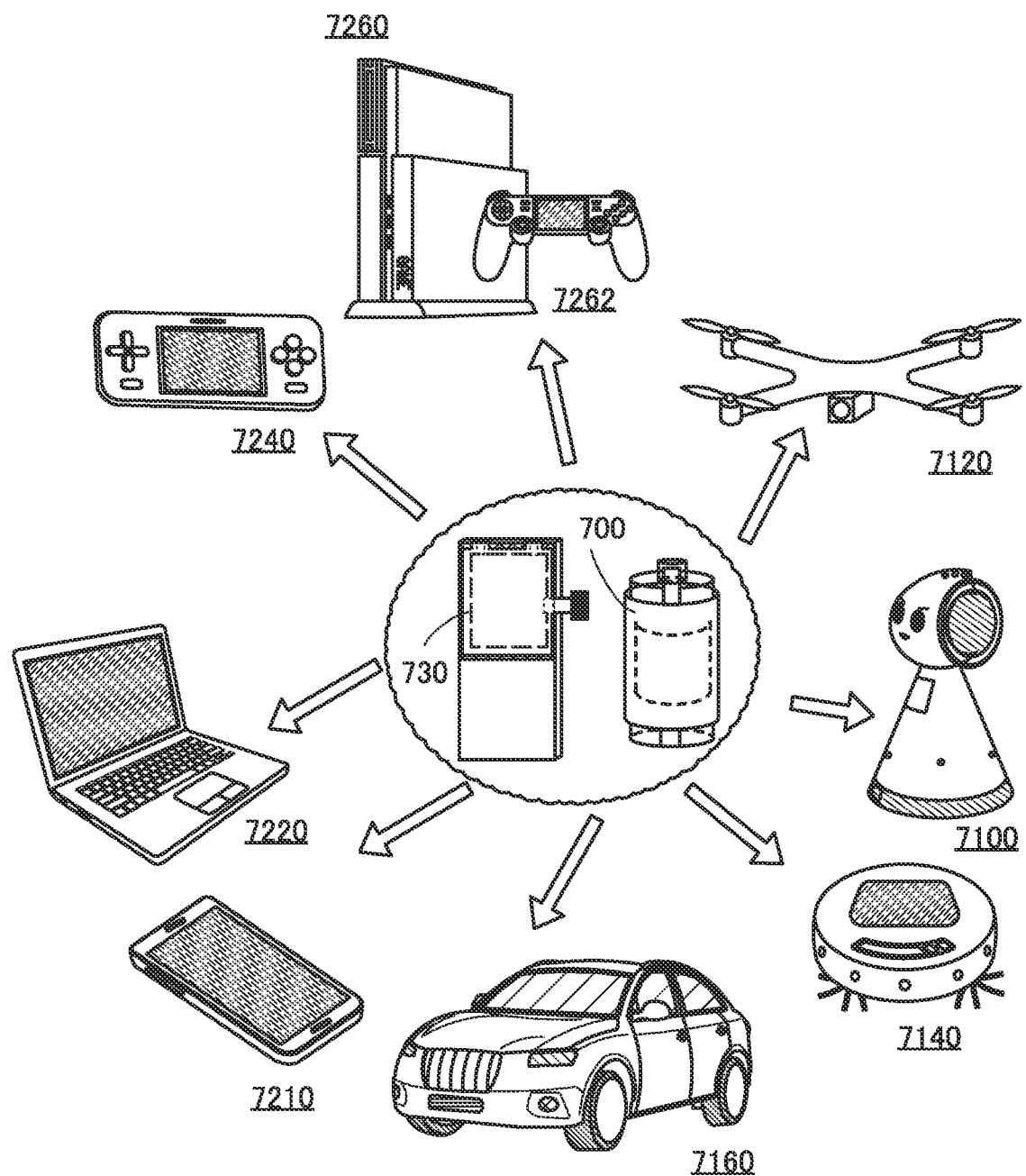
FIG. 17 is a diagram illustrating examples of electronic devices.

In this embodiment, examples of electronic devices which include a wireless charge control system and a wireless charge control circuit are described with reference to FIG. 17.

A robot 7100 includes a secondary battery, an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The use of the wireless charge control system and the wireless charge control circuit of one embodiment of the present invention for the secondary battery of the robot 7100 allows detection of abnormality, such as overcharge or a micro-short circuit, of the secondary battery.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user using the microphone and the speaker.

The camera has a function of taking images of the surroundings of the robot 7100. The robot 7100 has a function of moving with use of the moving mechanism. The robot 7100 can take images of the surroundings with use of the camera and analyze the images to sense whether there is an obstacle in the way of the movement.

A flying object 7120 includes propellers, a camera, a secondary battery, and the like and has a function of flying autonomously.

The use of the wireless charge control system and the wireless charge control circuit of one embodiment of the present invention for the secondary battery of the flying object 7120 allows detection of abnormality, such as overcharge or a micro-short circuit, of the secondary battery as well as a reduction in weight.

A cleaning robot 7140 includes a secondary battery, a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 can run autonomously, detect dust, and vacuum the dust through the inlet provided on the bottom surface. The use of the wireless charge control system and the wireless charge control circuit of one embodiment of the present invention, which are electrically connected to the secondary battery of the cleaning robot 7140, allows a reduction in the number of components and detection of abnormality, such as overcharge or a micro-short circuit, of the secondary battery.

An electric vehicle 7160 is shown as an example of a moving object. The electric vehicle 7160 includes a secondary battery, tires, a brake, a steering gear, a camera, and the like. The use of the wireless charge control system and the wireless charge control circuit of one embodiment of the present invention, which are electrically connected to the secondary battery of the electric vehicle 7160, allows a reduction in the number of components and detection of abnormality, such as overcharge or a micro-short circuit, of the secondary battery.

Note that although an electric vehicle is described above as an example of a moving object, the moving object is not limited to an electric vehicle. Examples of the moving object include a train, a monorail train, a ship, a flying object (a helicopter, an unmanned aircraft (a drone), an airplane, and a rocket), and the like. The use of the wireless charge control system and the wireless charge control circuit of one embodiment of the present invention, which are electrically connected to secondary batteries of these moving objects, allows a reduction in the number of components and detection of abnormality, such as overcharge or a micro-short circuit, of the secondary batteries.

A cylindrical secondary battery provided with a charge control circuit 700 and/or a battery pack provided with a charge control circuit 730 can be incorporated in a smartphone 7210, a PC 7220 (personal computer), a game machine 7240, a game machine 7260, and the like. Note that the cylindrical secondary battery provided with the charge control circuit 700 corresponds to the charge control circuit 10 described in Embodiment 1. Furthermore, the battery pack provided with the charge control circuit 730 corresponds to the charge control circuit 914 described in Embodiment 2. A structure that includes the charge control circuits 700 and 730 for controlling the safe operation of the small-sized battery pack but can overcome space limitations owing to miniaturization of the smartphone's housing can also be achieved.

The smartphone 7210 is an example of a portable information terminal. The smartphone 7210 includes a microphone, a camera, a speaker, various kinds of sensors, and a display portion. These peripheral devices are wirelessly controlled with the charge control system and the charge control circuit 730. The use of the wireless charge control system and the wireless charge control circuit of one embodiment of the present invention, which are electrically connected to the secondary battery of the smartphone 7210, allows a reduction in the number of components and detection of abnormality, such as overcharge or a micro-short circuit, of the secondary battery, leading to higher safety.

The PC 7220 is each an example of a laptop PC. The use of the wireless charge control system and the wireless charge control circuit of one embodiment of the present invention, which are electrically connected to the secondary battery of the laptop PC, allows a reduction in the number of components and detection of abnormality, such as overcharge or a micro-short circuit, of the secondary battery, leading to higher safety.

The game machine 7240 is an example of a portable game machine. The game machine 7260 is an example of a home-use stationary game machine. To the game machine 7260, a controller 7262 is connected with or without a wire. Incorporating the battery pack provided with the charge control circuit 730 and/or the cylindrical secondary battery provided with the charge control circuit in the controller 7262 enables a reduction in the number of components and detection of abnormality, such as overcharge or a micro-short circuit, of the secondary battery.

The charge control circuit 700 or the charge control circuit 730 can be provided for not only secondary batteries but also primary batteries; accordingly, power consumption can be reduced and thus a battery with suppressed leakage and long life can be achieved. Furthermore, a structure that can overcome space limitations owing to miniaturization of the housing can be achieved.

Figure 18A:
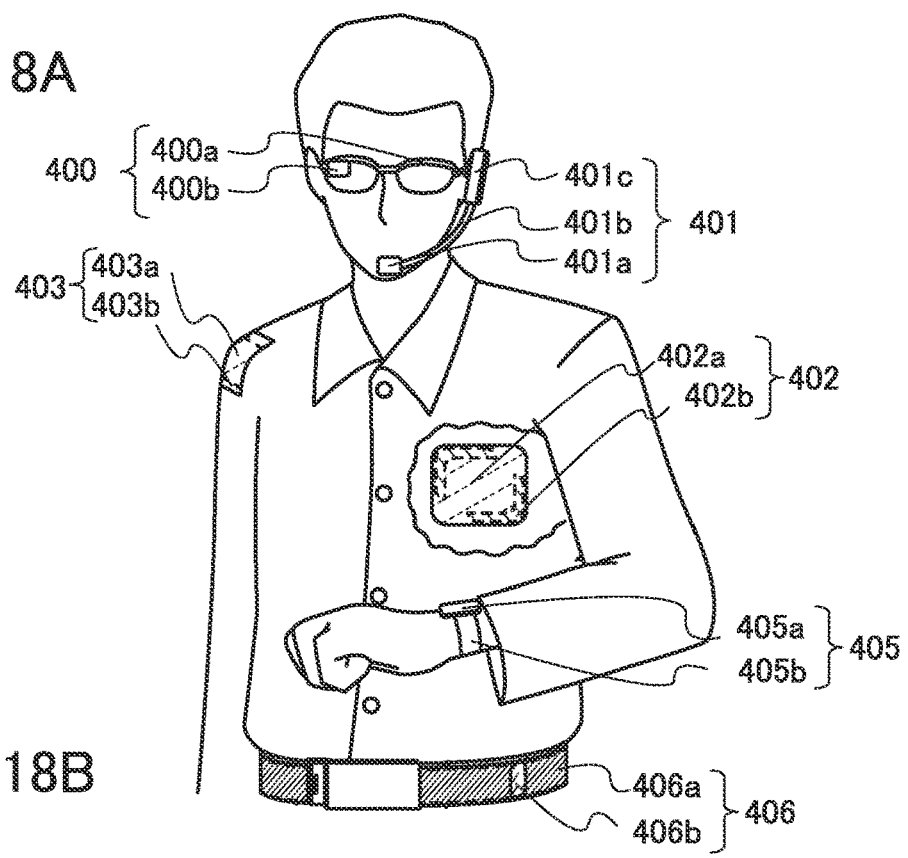
FIG. 18A and FIG. 18B are diagrams illustrating examples of electronic devices.

FIG. 18A illustrates examples of wearable devices. A primary battery or a secondary battery is used as a power source of a wearable device. To have improved water resistance in daily use or outdoor use by a user, a wearable device is desirably capable of being charged wirelessly as well as being charged with a wire whose connector portion for connection is exposed.

For example, it can be incorporated in a glasses-type device 400 as illustrated in FIG. 18A. The glasses-type device 400 includes a frame 400a and a display portion 400b. The primary battery or the secondary battery is provided in a temple of the frame 400a having a curved shape, whereby the glasses-type device 400 can have a well-balanced weight and can be used continuously for a long time. A charge control circuit may be provided on a side surface of the battery; thus, a structure that includes the circuit for controlling the safe operation of the primary battery but can overcome space limitations owing to miniaturization of the housing can be achieved.

Furthermore, it can be incorporated in a headset-type device 401. The headset-type device 401 includes at least a microphone portion 401a, a flexible pipe 401b, and an earphone portion 401c. A primary battery or a secondary battery can be provided in the flexible pipe 401b or the earphone portion 401c. A charge control circuit may be provided on a side surface of the battery; thus, a structure that includes the circuit for controlling the safe operation of the primary battery but can overcome space limitations owing to miniaturization of the housing can be achieved.

Furthermore, it can be incorporated in a device 402 that can be directly attached to a human body. A primary battery or secondary battery 402b can be provided in a thin housing 402a of the device 402. A charge control circuit may be provided on a side surface of the battery; thus, a structure that includes the circuit for controlling the safe operation of the primary battery but can overcome space limitations owing to miniaturization of the housing can be achieved.

It can also be incorporated in a device 403 that can be attached to clothing. A primary battery or secondary battery 403b can be provided in a thin housing 403a of the device 403. A charge control circuit may be provided on a side surface of the battery; thus, a structure that includes the circuit for controlling the safe operation of the primary battery but can overcome space limitations owing to miniaturization of the housing can be achieved.

It can also be incorporated in a watch-type device 405. The watch-type device 405 includes a display portion 405a and a belt portion 405b, and a primary battery or secondary battery can be provided in the display portion 405a or the belt portion 405b. A charge control circuit may be provided on a side surface of the battery; thus, a structure that includes the circuit for controlling the safe operation of the primary battery but can overcome space limitations owing to miniaturization of the housing can be achieved.

The display portion 405a can display various kinds of information such as reception information of an e-mail or an incoming call in addition to time.

Since the watch-type device 405 is a type of wearable device that is directly wrapped around an arm, a sensor that measures pulse, blood pressure, or the like of a user can be provided therein. Data on the exercise quantity and health of the user can be stored to be used for health maintenance.

Furthermore, it can be provided in a belt-type device 406. The belt-type device 406 includes a belt portion 406a and a wireless power feeding and receiving portion 406b, and the primary battery or the secondary battery can be included inside the belt portion 406a. A charge control circuit may be provided on a side surface of the battery; thus, a structure that includes the circuit for controlling the safe operation of the primary battery but can overcome space limitations owing to miniaturization of the housing can be achieved.

When the charge control system of one embodiment of the present invention is used as a power storage device of a daily electronic device, a lightweight product with a long lifetime can be provided. Examples of the daily electronic product include an electric toothbrush, an electric shaver, electric beauty equipment, and the like. As power storage devices of these products, in consideration of handling ease for users, small and lightweight stick type batteries with high capacity are desired. A charge control circuit may be provided on a side surface of the battery; thus, a structure that includes the circuit for controlling the safe operation of the secondary battery or the primary battery but can overcome space limitations owing to miniaturization of the housing can be achieved.

Figure 18B:
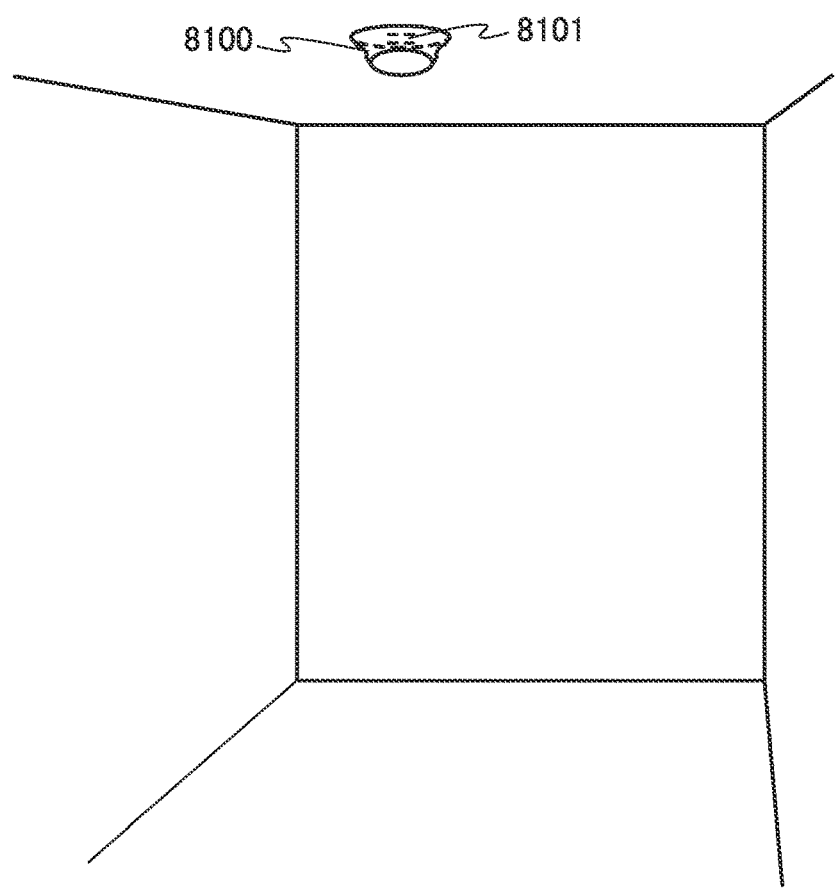

FIG. 18B illustrates an example of a fire alarm as a detector that uses a primary battery whose side surface is provided with a charge control circuit.

In FIG. 18B, an alarm system 8100 is a residential fire alarm, which includes a detection portion, a speaker portion, a microcomputer, and a battery 8101. On detection of abnormality, the alarm system 8100 can output sound from the speaker portion. A charge control circuit may be provided on a side surface of the battery 8101; thus, a battery which is provided with the circuit for controlling the safe operation of the secondary battery or the primary battery and has suppressed leakage and long life owing to the reduction of the power consumption can be achieved. Furthermore, a structure that can overcome space limitations owing to miniaturization of the housing can be achieved.

A fire alarm in this specification refers to any device which raises an alarm over fire occurrence instantly, and for example, a residential fire alarm, an automatic fire alarm system, and a fire detector used for the automatic fire alarm system are included in examples of a fire alarm.

This embodiment can be implemented in combination with any of the structures described in the other embodiments and the like, as appropriate.

REFERENCE NUMERALS

10: charge control circuit, 11: flexible substrate, 12: first terminal, 13: second terminal, 14: third terminal, 15: secondary battery, 16: charging circuit, 17: electronic device, 18: electrode, 19: electrode, 20: first switch, 22: power receiving circuit, 23: processor, 24: power supply circuit, 30: antenna, 31: primary coil, 100: memory cell, 101: secondary battery, 102: comparison circuit, 103: memory, 104: memory, 105: blocking switch, 106: control circuit, 201: positive electrode cap, 202: battery can, 203: positive electrode terminal, 204: positive electrode, 205: separator, 206: negative electrode, 207: negative electrode terminal, 208: insulating plate, 209: insulating plate, 211: PTC element, 212: safety valve mechanism, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 400: glasses-type device, 400*a*: frame, 400*b*: display portion, 401: headset-type device, 401*a*: microphone portion, 401*b*: flexible pipe, 401*c*: earphone portion, 402: device, 402*a*: housing, 402*b*: secondary battery, 403: device, 403*a*: housing, 403*b*: secondary battery, 405: watch-type device, 405*a*: display portion, 405*b*: belt portion, 406: belt-type device, 406*a*: belt portion, 406*b*: wireless power feeding and receiving portion, 500: transistor, 503: conductor, 503*a*: conductor, 503*b*: conductor, 505: conductor, 505*a*: conductor, 505*b*: conductor, 510: insulator, 510A: transistor, 510B: transistor, 510C: transistor, 510D: transistor, 510E: transistor, 510F: transistor, 511: insulator, 512: insulator, 514: insulator, 516: insulator, 518: conductor, 520: insulator, 521: insulator, 522: insulator, 524: insulator, 530: oxide, 530*a*: oxide, 530*b*: oxide, 530*c*: oxide, 531: region, 531*a*: region, 531*b*: region, 540*a*: conductor, 540*b*: conductor, 542: conductor, 542*a*: conductor, 542*b*: conductor, 543: region, 543*a*: region, 543*b*: region, 544: insulator, 545: insulator, 546: conductor, 546*a*: conductor, 546*b*: conductor, 547: conductor, 547*a*: conductor, 547*b*: conductor, 548: conductor, 550: insulator, 552: metal oxide, 560: conductor, 560*a*: conductor, 560*b*: conductor, 570: insulator, 571: insulator, 573: insulator, 574: insulator, 575: insulator, 576: insulator, 576*a*: insulator, 576*b*: insulator, 580: insulator, 581: insulator, 582: insulator, 584: insulator, 586: insulator, 600: capacitor, 610: conductor, 612: conductor, 620: conductor, 630: insulator, 650: insulator, 700: charge control circuit, 730: charge control circuit, 910: flexible substrate, 911: connection terminal, 913: secondary battery, 914: charge control circuit, 916: insulating sheet layer, 930: housing, 931: negative electrode, 932: positive electrode, 933: separator, 950: wound body, 951: terminal, 952: terminal, 1400: storage battery, 1402: positive electrode, 1404: negative electrode, 7100: robot, 7120: flying object, 7140: cleaning robot, 7160: electric vehicle, 7210: smartphone, 7220: PC, 7240: game machine, 7260: game machine, 7262: controller, 8100: alarm system, 8101: battery

The invention claimed is:

1. A charge control system comprising:
a secondary battery;
a first transmission path which is connected to a first terminal of the secondary battery and through which electric power output from the secondary battery is transmitted at the time of discharging;
a charge control circuit which is connected to the first transmission path and over a flexible substrate so as to be in contact with a side surface of the secondary battery;
a second transmission path which connects the charge control circuit and a second terminal of the secondary battery;
a first switch which blocks the second transmission path;
a charging circuit electrically connected to the charge control circuit;
a power receiving circuit electrically connected to the charging circuit;
an antenna electrically connected to the power receiving circuit;
a third transmission path through which electric power is supplied from the power receiving circuit through the charging circuit to the secondary battery at the time of charging; and
a second switch which blocks the third transmission path and is an output transistor of the charging circuit,
wherein the first transmission path is electrically connected to the charge control circuit through a first electrode,
wherein the second transmission path is electrically connected to the first switch through a second electrode,
wherein the first switch blocks the second transmission path when the secondary battery is overcharged,
wherein in the case where the charge control circuit judges that there is abnormality during charging of the secondary battery, the second transmission path is blocked and charging is stopped,
wherein the second switch blocks the third transmission path when the secondary battery is overcharged, and wherein the charging circuit notifies the power receiving circuit that charging has been completed.

2. The charge control system according to claim 1, wherein the first switch is a transistor comprising an oxide semiconductor.

3. The charge control system according to claim 1, wherein the second switch comprises an oxide semiconductor.

4. The charge control system according to claim 1, wherein the second switch is over a substrate different from a substrate for the first switch.

5. A semiconductor device comprising:
a secondary battery;
a first transmission path which is connected to a first terminal of the secondary battery and through which electric power output from the secondary battery is transmitted at the time of discharging;
a charge control circuit which is connected to the first transmission path and over a flexible substrate so as to be in contact with a side surface of the secondary battery;
a second transmission path which connects the charge control circuit and a second terminal of the secondary battery;
a blocking switch which blocks the second transmission path; and
a charging circuit electrically connected to the charge control circuit,
wherein the first transmission path is electrically connected to the charge control circuit through a first electrode,
wherein the second transmission path is electrically connected to the blocking switch through a second electrode, and
wherein the charge control circuit controls both the blocking switch and an output transistor of the charging circuit.

6. The semiconductor device according to claim 5, wherein the blocking switch is a transistor comprising an oxide semiconductor.

7. The semiconductor device according to claim 5, wherein the output transistor comprises an oxide semiconductor.

8. The semiconductor device according to claim 5, wherein the output transistor is over a substrate different from a substrate for the blocking switch.

9. A charge control system comprising:
a secondary battery;
a charge control circuit electrically connected to the secondary battery;
a charging circuit electrically connected to the charge control circuit;
a first switch between the charge control circuit and one of a first terminal and a second terminal of the secondary battery;
a second switch as an output transistor of the charging circuit, circuit;
a first electrode electrically connected to the charge control circuit; and
a second electrode electrically connected to the first switch,
wherein the secondary battery has a cylindrical shape,
wherein the charge control circuit is over a flexible substrate which is attached to a side surface of the secondary battery, and
wherein the charge control circuit is configured to turn off the first switch and the second switch in the case where abnormality of the secondary battery is detected.

10. The charge control system according to claim 9, wherein the first switch is a transistor comprising an oxide semiconductor.

11. The charge control system according to claim 9, wherein the second switch comprises an oxide semiconductor.

12. The charge control system according to claim 9, wherein the second switch is over a substrate different from a substrate for the first switch.

* * * * *